(12) United States Patent
Kanno et al.

(10) Patent No.: US 7,994,415 B2
(45) Date of Patent: Aug. 9, 2011

(54) THERMOELECTRIC DEVICE AND POWER GENERATION METHOD USING THE SAME

(75) Inventors: Tsutomu Kanno, Kyoto (JP); Akihiro Sakai, Osaka (JP); Kohei Takahashi, Osaka (JP); Satoshi Yotsuhashi, Osaka (JP); Hideaki Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/811,182

(22) PCT Filed: Oct. 26, 2009

(86) PCT No.: PCT/JP2009/005641
§ 371 (c)(1),
(2), (4) Date: Jun. 29, 2010

(87) PCT Pub. No.: WO2010/058526
PCT Pub. Date: May 27, 2010

(65) Prior Publication Data
US 2010/0282286 A1 Nov. 11, 2010

(30) Foreign Application Priority Data

Nov. 21, 2008 (JP) .................................. 2008-297545

(51) Int. Cl.
*H01L 35/30* (2006.01)
(52) U.S. Cl. ........ 136/204; 136/238; 136/239; 136/240; 136/241
(58) Field of Classification Search ........... 136/200–242
See application file for complete search history.

(56) References Cited

U.S. PATENT DOCUMENTS

| 7,601,909 B2 | 10/2009 | Kanno et al. |
| 2008/0230107 A1 | 9/2008 | Zenitani et al. |

FOREIGN PATENT DOCUMENTS

| JP | 2001-358373 | 12/2001 |
| JP | 2005-277222 | 10/2005 |
| JP | 4078392 | 2/2008 |
| WO | 2008/108034 | 9/2008 |

OTHER PUBLICATIONS

Snarskii, et al., "Thermoelectrics Handbook", Chapter 45, CRC Press, 2006, pp. 45-1-45-11.

*Primary Examiner* — Basia Ridley
*Assistant Examiner* — Thanh-Truc Trinh
(74) *Attorney, Agent, or Firm* — Hamre, Schumann, Mueller & Larson, P.C.

(57) ABSTRACT

The thermoelectric device of the present invention includes a first electrode and a second electrode that are disposed to be opposed to each other, and a laminate that is interposed between the first electrode and the second electrode, is connected electrically to both the first electrode and the second electrode, and is layered in the direction orthogonal to an electromotive-force extracting direction, which is the direction in which the first electrode and the second electrode are opposed to each other. The laminate includes a thermoelectric material layer as well as a first holding layer and a second holding layer that are disposed so as to interpose the thermoelectric material layer therebetween, the first holding layer and the second holding layer have layered structures with metals and insulators that are layered alternately, respectively, a layered direction of the layered structures is parallel with a layer surface of the laminate and is inclined with respect to the electromotive-force extracting direction, the insulators of the first holding layer and the insulators of the second holding layer are disposed so as to appear alternately in the layered direction, and a temperature difference is generated in the direction orthogonal to the layered direction of the laminate and orthogonal to the electromotive-force extracting direction, so that electrical power is output through the first electrode and the second electrode.

35 Claims, 6 Drawing Sheets

S1 Producing a three-layer layered structure

S2 Groove machining

S3 Forming electrical insulators in groove portions

S4 Producing a first electrode and a second electrode

FIG.7A

THERMOELECTRIC DEVICE AND POWER GENERATION METHOD USING THE SAME

TECHNICAL FIELD

The present invention relates to a thermoelectric device that converts thermal energy to electrical energy, and a power generation method using the same.

BACKGROUND ART

Thermoelectric generation technology is a technology for directly converting thermal energy into electrical energy using the Seebeck effect, in which an electromotive force is generated in proportion to a temperature difference created between opposite ends of a substance. This technology is being used practically for example, for a remote area power supply, an outer space power supply, and a military power supply.

A conventional thermoelectric device has a configuration that is referred to as a "π-type structure" in which thermoelectric materials of a p-type semiconductor and an n-type semiconductor, having carriers of opposite signs, are combined together to be connected to each other thermally in parallel and electrically in series.

Generally, the performance of a thermoelectric material used for a thermoelectric device is evaluated by a figure of merit Z, or a figure of merit ZT that is obtained by multiplying a figure of merit Z by absolute temperature to be non-dimensionalized. The figure of merit ZT can be expressed as $ZT = S^2 T/\rho\kappa$, where S is a Seebeck coefficient, $\rho$ is electrical resistivity, and $\kappa$ is thermal conductivity, of a substance. The figure $S^2/\rho$, which is indicated by the Seebeck coefficient S and electrical resistivity $\rho$, is a value referred to as a power factor that is used as a measure for determining the quality of the power generation performance of the thermoelectric material and thermoelectric conversion device under a constant temperature difference.

$Bi_2Te_3$ based materials such as $Bi_{2-a}Sb_aTe_3$ ($0 \leq a \leq 2$) that currently is used practically as the thermoelectric material have relatively high thermoelectric properties with a ZT of about 1 and a power factor of 40 to 50 $\mu W/cmK^2$ under the present conditions. However, even the thermoelectric device having a π-type structure containing the $Bi_2Te_3$ based material used therein cannot be said to have a sufficiently high power generation performance for being used practically in a wider range of applications.

Meanwhile, as a thermoelectric device having a structure other than the π-type structure, a thermoelectric device long has been proposed that takes advantage of the anisotropy of thermoelectric properties of natural or artificially-produced layered structures (see, for example, Non-Patent Literature 1). Patent Literature 1 describes a thermoelectric device that takes advantage of the anisotropy of thermoelectric properties of a layered structure composed of metal and Bi, which is a thermoelectric material. The thermoelectric device described in Patent Literature 1 has a power factor that surpasses by far that of the thermoelectric device having a π-type structure containing a material Bi or the $Bi_2Te_3$ based material used therein, by suitably selecting the ratio in thickness between metal and Bi or the inclination angle in the layered direction.

[Prior Art Literature]
[Patent Literature]
[Patent Literature 1] JP 4078392 B
[Non-Patent Literature]
[Non-Patent Literature 1] A. A. Snarskii, P. Bulat, "THERMOELECTRICS HANDBOOK", Chapter 45, CRC Press (2006)

SUMMARY OF THE INVENTION

However, in the thermoelectric device described in Non-Patent Literature 1, ZT is not high and cannot be considered to be improved. Therefore, technical developments have been made primarily for measurement applications such as infrared sensors, instead of applications concerning thermoelectric generation. Furthermore, as described above, it cannot be said that the thermoelectric device having a π-type structure has a sufficiently high power generation performance for being used practically in a wider range of applications. The thermoelectric device described in Patent Literature 1 has a higher power factor than that of a thermoelectric device having a π-type structure. However, there is a need for thermoelectric devices with a further increased power factor.

The present invention was made with the above-mentioned situation in mind and is intended to provide a thermoelectric device having a high power generation performance and a power generation method using the same.

As a result of various studies, the present inventors found that the above-mentioned object was achieved by the present invention described below. That is, a thermoelectric device according to an embodiment of the present invention includes a first electrode and a second electrode that are disposed to be opposed to each other, and a laminate that is interposed between the first electrode and the second electrode, is connected electrically to both the first electrode and the second electrode, and is layered in a direction orthogonal to the electromotive-force extracting direction, which is the direction in which the first electrode and the second electrode are opposed to each other, wherein the laminate includes a thermoelectric material layer as well as a first holding layer and a second holding layer that are disposed so as to interpose the thermoelectric material layer therebetween. The first holding layer and the second holding layer have layered structures with metals and insulators that are layered alternately, respectively, and the layered direction of the layered structures is parallel with a layer surface of the laminate and is inclined with respect to the electromotive-force extracting direction. The insulators of the first holding layer and the insulators of the second holding layer are disposed so as to appear alternately in the layered direction, and a temperature difference is generated in the direction orthogonal to the layered direction of the laminate and orthogonal to the electromotive-force extracting direction, so that electrical power is output through the first electrode and the second electrode.

Furthermore, a power generation method according to another embodiment of the present invention is a power generation method using a thermoelectric device, in which a temperature difference is generated in the thermoelectric device and thereby electrical power is obtained from the thermoelectric device, wherein the thermoelectric device includes a first electrode and a second electrode that are disposed to be opposed to each other, and a laminate that is interposed between the first electrode and the second electrode, is connected electrically to both the first electrode and the second electrode, and is layered in a direction orthogonal to the electromotive-force extracting direction, which is the direction in which the first electrode and the second electrode are opposed to each other. The laminate includes a thermoelectric material layer as well as a first holding layer and a second holding layer that are disposed so as to interpose the thermoelectric material layer therebetween. The first holding layer and the second holding layer have layered structures with metals and insulators that are layered alternately, respectively, and the layered direction of the layered structures is parallel with a layer surface of the laminate and is inclined with respect to the electromotive-force extracting direction. The insulators of the first holding layer and the insulators of the second holding layer are disposed so as to appear alternately in the layered direction, and a temperature difference is generated in the direction orthogonal to the layered direction of the laminate and orthogonal to the electromotive-force extracting direction, so that electrical power is obtained through the first electrode and the second electrode.

EFFECT OF THE INVENTION

The present invention can provide a thermoelectric device having a high power generation performance and a power generation method using the same.

BRIEF DESCRIPTION OF THE DRAWINGS

FIG. 7A is a flow chart showing the process of producing the thermoelectric device according to Embodiment 1 of the present invention.

DETAILED DESCRIPTION OF THE INVENTION

Hereinafter, embodiments of the present invention are described with reference to the drawings.

Embodiment 1

Figure 1:
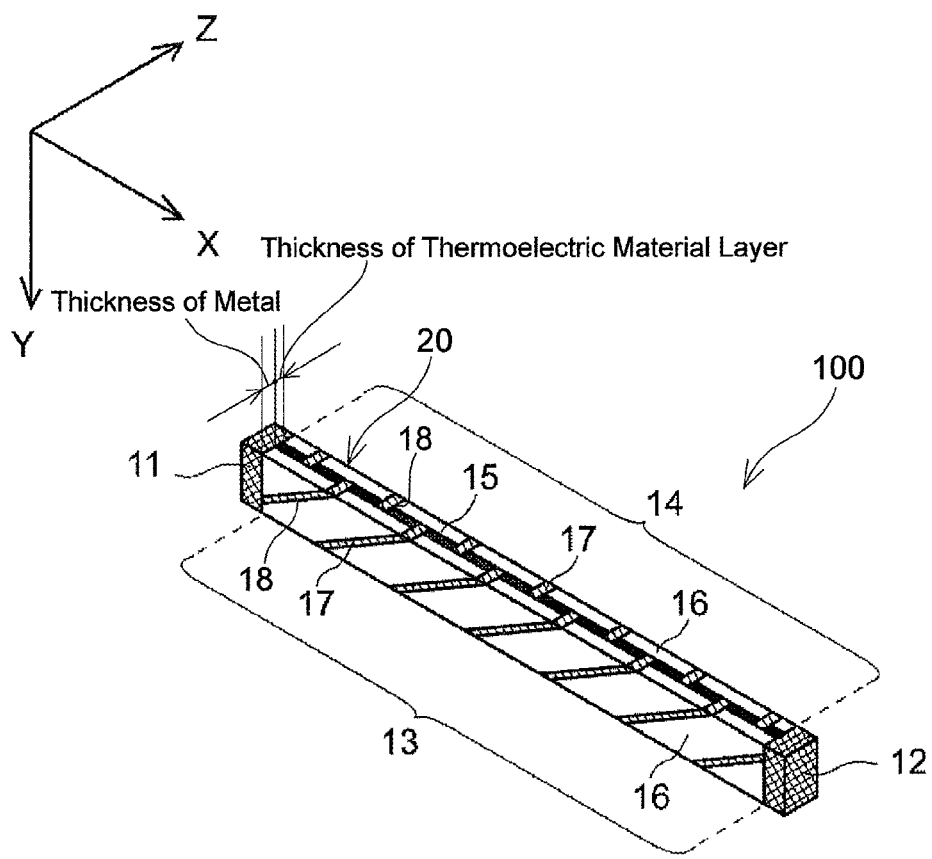
FIG. 1 is a perspective view of a thermoelectric device according to Embodiment 1 of the present invention.

FIG. 1 is a perspective view of a thermoelectric device according to Embodiment 1 of the present invention. As shown in FIG. 1, the thermoelectric device 100 according to Embodiment 1 includes a first electrode 11 and a second electrode 12 that are disposed to be opposed to each other and a laminate 20 that is disposed to be interposed between the first electrode 11 and the second electrode 12 and is connected electrically to both the first electrode 11 and the second electrode 12.

The first electrode 11 and the second electrode 12 each are preferably a material with a high electrical conductivity, for example, a metal such as Cu, Ag, Mo, W, Al, Ti, Cr, Au, Pt, or In or a nitride or oxide such as TiN, indium tin oxide (ITO), or $SnO_2$. Furthermore, the first electrode 11 and the second electrode 12 may be formed using a solder or a conductive paste.

The laminate 20 includes a first holding layer 13, a thermoelectric material layer 15, and a second holding layer 14, which are layered together sequentially. That is, the thermoelectric material layer 15 is interposed between the first holding layer 13 and the second holding layer 14.

Hereinafter, the direction in which the first electrode 11 and the second electrode 12 are opposed to each other is referred to as an electromotive-force extracting direction. The electromotive-force extracting direction is the direction X shown in FIG. 1. The layered direction of the laminate 20 is orthogonal to the electromotive-force extracting direction, which is the direction Z shown in FIG. 1. The direction Y shown in FIG. 1 is orthogonal to the direction X and the direction Z.

The first holding layer 13 and the second holding layer 14 each have a layered structure in which metals and insulators are disposed to be layered alternately and periodically. Therefore, the thermoelectric material layer 15 is in contact with the metals 16 and the insulators 17. Furthermore, the direction in which the metals 16 and the insulators 17 are layered in the first holding layer 13 and the second holding layer 14 is parallel with a layer surface (X-Y plane) of the laminate 20 and is inclined with respect to the electromotive-force extracting direction (the direction X).

Figure 2:
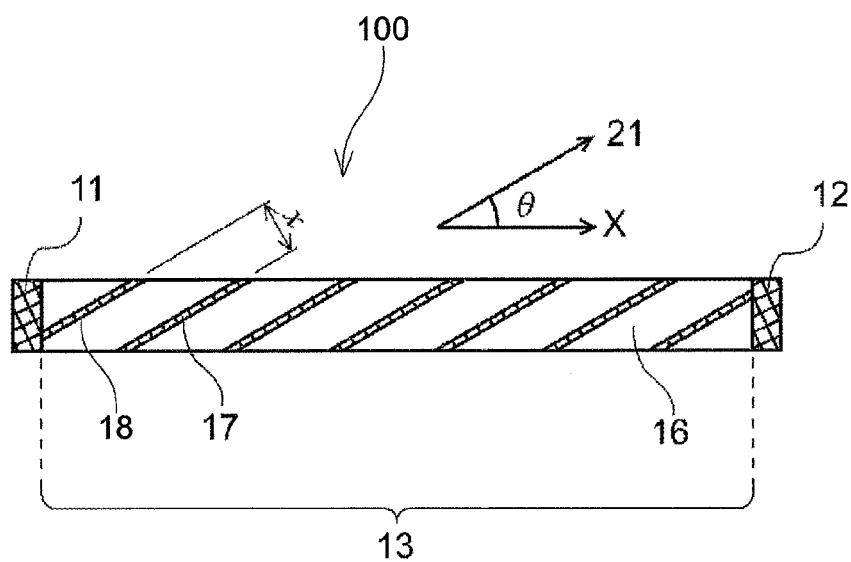
FIG. 2 is an elevational view of the thermoelectric device according to Embodiment 1 of the present invention.

FIG. 2 is an elevational view of the thermoelectric device according to Embodiment 1 of the present invention. As shown in FIG. 2, the layer surfaces 18 of the first holding layer 13 and the second holding layer 14 are inclined with respect to the electromotive-force extracting direction (the direction X). The direction 21 of the layer surfaces 18 is inclined with respect to the direction X (the electromotive-force extracting direction) by an angle θ, Specifically, the direction 21 is a direction of the line formed at the intersection of the layer surface (X-Y plane) of the laminate 20 and the layer surfaces 18.

Preferred examples of the thermoelectric material that composes the thermoelectric material layer 15 of Embodiment 1 include $Bi_{2-a}Sb_aTe_3$, Bi, PbTe, $Si_{0.8}Ge_{0.2}$, CoSi, $SrTiO_3$, and $Na_bCoO_2$, where a and b are $0 \leq a \leq 2$ and $0.3 \leq b \leq 0.8$. These thermal conversion materials have suitable properties for the configuration of the thermoelectric device 100 and therefore make it possible to provide the thermoelectric device 100 with a high power generation performance. The thermoelectric material to be used may be one other than those. Even in that case, the thermoelectric device 100 has a sufficiently high power generation performance.

Furthermore, when $Si_{0.8}Ge_{0.2}$ is used as the material for the thermoelectric material layer 15, impurities such as B (boron), P (phosphorus), and Al may be contained. When $SrTiO_3$ is used as the material for the thermoelectric material layer 15, impurities such as La and Nb may be contained. When $Na_bCoO_2$ ($0.3 \leq b \leq 0.8$) is used as the material for the thermoelectric material layer 15, impurities such as Sr and Ca may be contained. Depending on the production method, a deviation in composition may occur in the thermoelectric material layer 15. It, however, does not impair the performance significantly as long as the deviation does not exceed 20% of the specified composition ratio, and therefore it is allowable.

In the first holding layer 13 and the second holding layer 14, the insulators 17 and the metals 16 are disposed periodically. Furthermore, the insulators 17 of the first holding layer 13 and those of the second holding layer 14 are identical to each other with respect to the layered direction and the period at which they are layered. Therefore, insulators 17 adjacent to one another are disposed at regular intervals. The period at which the insulators 17 are layered in each of the first holding layer 13 and the second holding layer 14 is the period x (see FIG. 2). The insulators 17 of the first holding layer 13 and the insulators 17 of the second holding layer 14 are disposed to appear alternately in the direction they are layered. Preferably, the insulators 17 of the first holding layer 13 and the insulators 17 of the second holding layer 14 are disposed to be offset from each other by half the period x in the direction they are layered.

As described above, in the thermoelectric device 100, it is preferable that the insulators 17 of the first holding layer 13 and those of the second holding layer 14 be disposed periodically, respectively, but even in the case of a configuration in which they are not disposed periodically, the thermoelectric device 100 can generate electrical power. However, with the configuration in which the insulators 17 are disposed periodically, the thermoelectric device 100 exhibits better properties.

It is most preferable that the offset in position of the insulators 17 of the first holding layer 13 and the insulators 17 of the second holding layer 14 in the layered direction be half the period x (0.5 period). In this case, the thermoelectric device 100 exhibits the most preferable properties. However, even when the offset in position is other than that, the thermoelectric device 100 can generate electrical power. The offset in position is preferably 0.3 to 0.7 of the period x and further preferably 0.4 to 0.6 of the period x. When the offset in position is in the range of 0.3 to 0.7 of the period x, this offset in position is referred to as an offset of substantially half the period in this specification.

Figure 3:
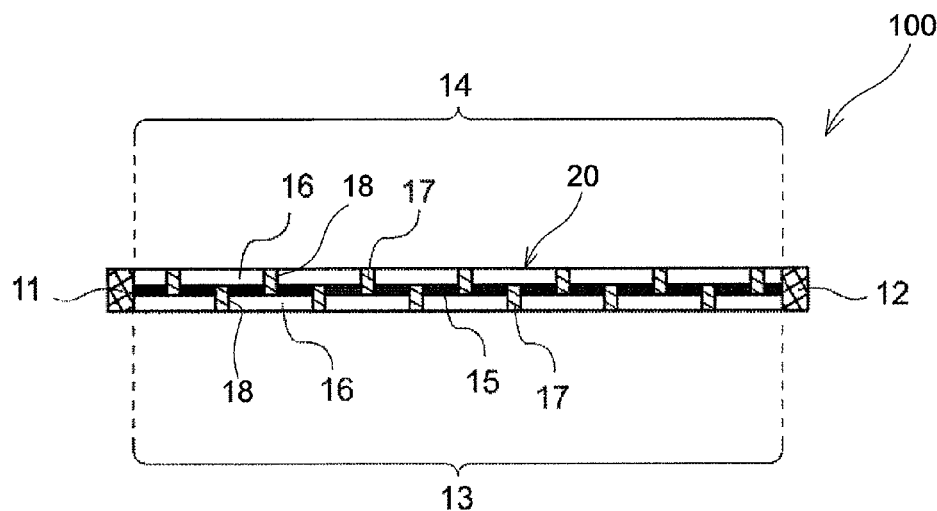
FIG. 3 is a plan view of the thermoelectric device according to Embodiment 1 of the present invention.
Figure 4:
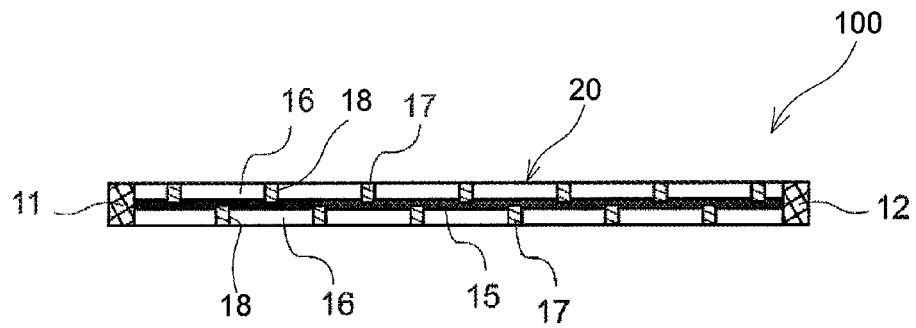
FIG. 4 is a plan view showing a first modified example of a thermoelectric device according to Embodiment 1 of the present invention.
Figure 5:
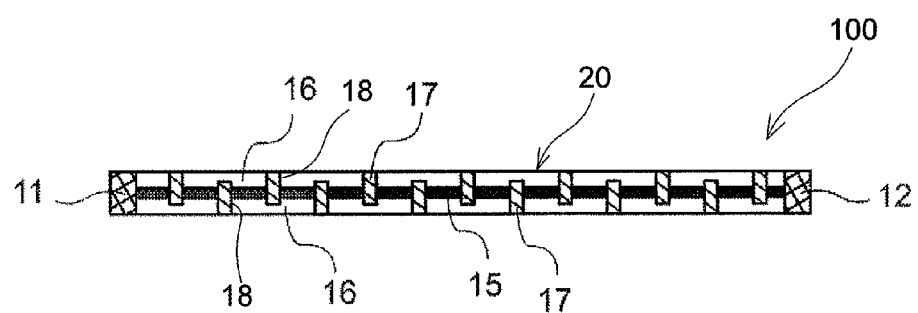
FIG. 5 is a plan view showing a second modified example of the thermoelectric device according to Embodiment 1 of the present invention.

The thickness of each insulator 17 in the layered direction (the direction Z) of the laminate 20 is not limited as long as it is equal to or more than that of each metal 16. FIG. 3 is a plan view of the thermoelectric device according to Embodiment 1 of the present invention. For example, as shown in FIGS. 1 and 3, the thickness of each insulator 17 in the direction Z is preferably equal to the sum of the thickness of one metal 16 and that of the thermoelectric material layer 15 in the direction Z but may be other than that. FIG. 4 is a plan view showing a first modified example of the thermoelectric device according to Embodiment 1 of the present invention. FIG. 5 is a plan view showing a second modified example of the thermoelectric device according to Embodiment 1 of the present invention. As shown in FIG. 4, the insulators 17 may be formed to penetrate into a part of the thermoelectric material layer 15. Furthermore, as shown in FIG. 5, the insulators 17 of the first holding layer 13 may divide the thermoelectric material layer 15 to reach the second holding layer 14, while the insulators 17 of the second holding layer 14 may divide the thermoelectric material layer 15 to reach the first holding layer 13. However, the laminate 20 is not divided completely by the insulators 17.

Preferably, the metals 16 of the first holding layer 13 and the second holding layer 14 have a high thermal conductivity and a low electrical resistivity. This allows the thermoelectric device 100 to have a high power generation performance. Preferably, for example, Cu, Ag, Au, Al, or an alloy composed of such materials is used for the metals 16. Furthermore, when, for example, the electrical conductivity, the thermal conductivity, and the degree of production difficulty are taken into consideration, the metals 16 are more preferably Cu, Ag, or Au as compared to Al and particularly preferably Cu or Ag.

The material for the insulators 17 is not particularly limited as long as it has electrical insulation properties. Specifically, for example, an oxide such as $SiO_2$, $Al_2O_3$, $ZrO_2$, or $Ta_2O_5$, a nitride such as $Si_3N_4$, or a resin such as epoxy is preferable. Furthermore, the insulators 17 each may be a gas such as air or nitrogen, or vacuum. For example, when grooves are formed in the positions where the insulators 17 are disposed and the thermoelectric device 100 is operated in the air, the insulators 17 can be the air. Moreover, when the thermoelectric device 100 with grooves formed in the positions where the insulators 17 are disposed is installed and operated in a container that is filled with a gas other than the air and is sealed so as to prevent the gas from leaking, the insulators 17 are the gas with which the container is filled. When this container is brought into a vacuum state, the insulators 17 are vacuum. As compared to the case where the insulators 17 are solid, when the insulators 17 are, for example, the air, the thermoelectric device 100 can be reduced in weight but attention should be paid to deterioration in strength.

Figure 6:
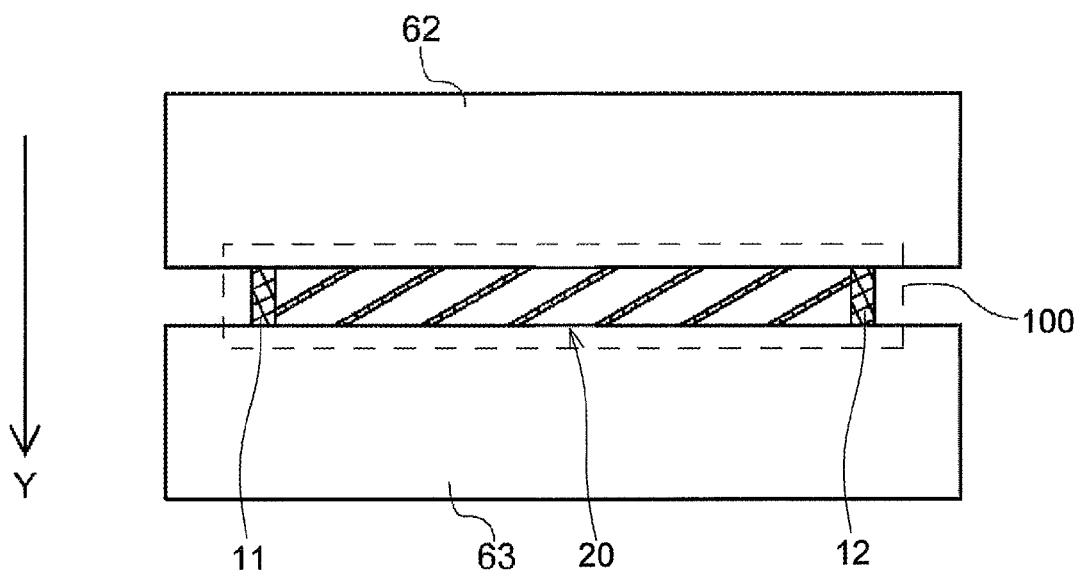
FIG. 6 is an elevational view showing the configuration for driving the thermoelectric device according to Embodiment 1 of the present invention.

FIG. 6 is an elevational view showing the configuration for driving the thermoelectric device according to Embodiment 1 of the present invention. When the thermoelectric device 100 is to be driven, a temperature difference is generated in the direction Y In order to generate a temperature gradient in the direction Y in the thermoelectric device 100, a high-temperature body 62 and a low-temperature body 63 are disposed to be opposed to each other along the direction Y and are brought into close contact with the thermoelectric device 100. The high-temperature body 62 and the low-temperature body 63 each are, for example, a heater or a radiator. The high-temperature body 62 and the low-temperature body 63 generate a temperature difference in the direction Y in the thermoelectric device 100, thereby an electromotive force is generated in the laminate 20, and the thermoelectric device 100 then outputs electrical power through the first electrode 11 and the second electrode 12.

In a conventional thermoelectric device having a π-type structure, an electromotive force is generated in the direction parallel to the direction in which a temperature difference is generated, but it is not generated in the direction perpendicular thereto. In the thermoelectric device 100, however, the direction in which a temperature gradient is generated (the direction Y) is different from the electromotive-force extracting direction (the direction X). That is, the thermoelectric device 100 generates electrical power by using the anisotropy of thermoelectric properties of the layered structure formed of different types of materials. The laminate 20 has a structure in which the first holding layer 13 and the second holding layer 14, each of which is a layered structure formed of the metals 16 and the insulators 17, and the thermoelectric material layer 15 are layered together. Since the laminate 20 has such a structure, an electromotive force is generated along the electromotive-force extracting direction (the direction X), which is different from the direction in which a temperature difference is generated (the direction Y), in the thermoelectric device.

As described later in Examples, the present inventors studied various conditions for operating the thermoelectric device 100 and tried to optimize them. In the process of detail studies of the relationship between predetermined conditions and the thermoelectric performance in the thermoelectric device 100, they found that an unexpectedly high thermoelectric performance was obtained. Specifically, they studied about the thermoelectric performance with respect to the angle (angle θ) formed between the direction 21 of the layer surface 18 and the electromotive-force extracting direction (the direction X). Furthermore, they studied about the thermoelectric performance with respect to the ratio of the period at which the insulators 17 were layered (the period x) and the thickness of each metal 16 in the first holding layer 13 and the second holding layer 14. Moreover, they studied about the thermoelectric performance with respect to the ratio of the period x and the thickness of the thermoelectric material layer 15. The results of these studies are described later. The thickness of the metal 16 or the thickness of the thermoelectric material layer 15 is that in the layered direction (the direction Z) in the laminate 20 (see FIG. 1).

In the thermoelectric device 100, when the material for the thermoelectric material layer 15 is $Bi_{2-a}Sb_aTe_3$ ($0 \leq a \leq 2$), the ratio of the period x and the thickness of the metal 16 is preferably in the range of 100:1 to 0.4:1 and more preferably in the range of 40:1 to 1:1 (which is described later, see Example 2). As will be appreciated from the example, the thermoelectric device 100 has very practical values of power factor ($S^2/\rho$) when the ratio of the period x and the thickness of the metal 16 is in these ranges.

In this thermoelectric device 100, the ratio of the period x and the thickness of the thermoelectric material layer ($Bi_{2-a}Sb_aTe_3$ layer) 15 is preferably in the range of 1000:1 to 20:1 and more preferably in the range of 400:1 to 100:1 (which is described later, see Example 3). As will be appreciated from the example, the thermoelectric device 100 has very practical values of power factor ($S^2/\rho$) when the ratio of the period x and the thickness of the thermoelectric material layer 15 is in these ranges.

In this thermoelectric device 100, it is preferable that the angle θ be formed so as to be in the range of 10° to 70°, and it is more preferably in the range of 20° to 50° (which is described later, see Example 1). As will be appreciated from the example, the thermoelectric device 100 has very practical values of power factor ($S^2/\rho$) when the angle θ is in these ranges.

Furthermore, in the thermoelectric device 100, when the material for the thermoelectric material layer 15 is Bi, the ratio of the period x and the thickness of the metal 16 is preferably in the range of 20:1 to 1:1 and more preferably in the range of 10:1 to 2.5:1 (which is described later, see Example 6). As will be appreciated from the example, the thermoelectric device 100 has very practical values of power factor ($S^2/\rho$) when the ratio of the period x and the thickness of the metal 16 is in these ranges.

In this thermoelectric device 100, the ratio of the period x and the thickness of the thermoelectric material layer (Bi layer) 15 is preferably in the range of 100:1 to 5:1 and more preferably in the range of 50:1 to 10:1 (which is described later, see Example 7). As will be appreciated from the example, the thermoelectric device 100 has very practical values of power factor ($S^2/\rho$) when the ratio of the period x and the thickness of the thermoelectric material layer 15 is in these ranges.

In this thermoelectric device 100, it is preferable that the angle θ be formed so as to be in the range of 20° to 60°, and it is more preferably in the range of 20° to 50° (which is described later, see Example 5). As will be appreciated from the example, the thermoelectric device 100 has very practical values of power factor ($S^2/\rho$) when the angle θ is in these ranges.

Furthermore, in the thermoelectric device 100, when the material for the thermoelectric material layer 15 is PbTe, the ratio of the period x and the thickness of the metal 16 is preferably in the range of 100:1 to 0.4:1 and more preferably in the range of 40:1 to 1:1 (which is described later, see Example 10). As will be appreciated from the example, the thermoelectric device 100 has very practical values of power factor ($S^2/\rho$) when the ratio of the period x and the thickness of the metal 16 is in these ranges.

In this thermoelectric device 100, the ratio of the period x and the thickness of the thermoelectric material layer (PbTe layer) 15 is preferably in the range of 1000:1 to 10:1 and more preferably in the range of 400:1 to 40:1 (which is described later, see Example 11). As will be appreciated from the example, the thermoelectric device 100 has very practical values of power factor ($S^2/\rho$) when the ratio of the period x and the thickness of the thermoelectric material layer 15 is in these ranges.

In this thermoelectric device 100, it is preferable that the angle θ be formed so as to be in the range of 10° to 60°, and it is more preferably in the range of 20° to 50° (which is described later, see Example 9). As will be appreciated from the example, the thermoelectric device 100 has very practical values of power factor ($S^2/\rho$) when the angle θ is in these ranges.

Furthermore, in the thermoelectric device 100, when the material for the thermoelectric material layer 15 is $Si_{0.8}Ge_{0.2}$, the ratio of the period x and the thickness of the metal 16 is preferably in the range of 20:1 to 1.67:1 and more preferably in the range of 10:1 to 2:1 (which is described later, see Example 14). As will be appreciated from the example, the thermoelectric device 100 has very practical values of power factor ($S^2/\rho$) when the ratio of the period x and the thickness of the metal 16 is in these ranges.

In this thermoelectric device 100, the ratio of the period x and the thickness of the thermoelectric material layer ($Si_{0.8}Ge_{0.2}$ layer) 15 is preferably in the range of 250:1 to 10:1 and more preferably in the range of 100:1 to 25:1 (which is described later, see Example 15). As will be appreciated from the example, the thermoelectric device 100 has very practical values of power factor ($S^2/\rho$) when the ratio of the period x and the thickness of the thermoelectric material layer 15 is in these ranges.

In this thermoelectric device 100, it is preferable that the angle θ be formed so as to be in the range of 10° to 50°, and it is more preferably in the range of 20° to 40° (which is described later, see Example 13). As will be appreciated from the example, the thermoelectric device 100 has very practical values of power factor ($S^2/\rho$) when the angle θ is in these ranges.

Furthermore, in the thermoelectric device 100, when the material for the thermoelectric material layer 15 is CoSi, the ratio of the period x and the thickness of the metal 16 is preferably in the range of 20:1 to 1.25:1 and more preferably in the range of 10:1 to 2.5:1 (which is described later, see Example 18). As will be appreciated from the example, the thermoelectric device 100 has very practical values of power factor ($S^2/\rho$) when the ratio of the period x and the thickness of the metal 16 is in these ranges.

In such a thermoelectric device 100, the ratio of the period x and the thickness of the thermoelectric material layer (CoSi layer) 15 is preferably in the range of 100:1 to 6.25:1 and more preferably in the range of 50:1 to 12.5:1 (which is described later, see Example 19). As will be appreciated from the example, the thermoelectric device 100 has very practical values of power factor ($S^2/\rho$) when the ratio of the period x and the thickness of the thermoelectric material layer 15 is in these ranges.

In this thermoelectric device 100, it is preferable that the angle θ be formed so as to be in the range of 20° to 50°, and it is more preferably in the range of 20° to 40° (which is described later, see Example 17). As will be appreciated from the example, the thermoelectric device 100 has very practical values of power factor ($S^2/\rho$) when the angle θ is in these ranges.

Furthermore, in the thermoelectric device 100, when the material for the thermoelectric material layer 15 is $SrTiO_3$, the ratio of the period x and the thickness of the metal 16 is preferably in the range of 20:1 to 1.25:1 and more preferably in the range of 10:1 to 2.5:1 (which is described later, see Example 22). As will be appreciated from the example, the thermoelectric device 100 has very practical values of power factor ($S^2/\rho$) when the ratio of the period x and the thickness of the metal 16 is in these ranges.

In this thermoelectric device 100, the ratio of the period x and the thickness of the thermoelectric material layer ($SrTiO_3$ layer) 15 is preferably in the range of 250:1 to 8:1 and more preferably in the range of 100:1 to 10:1 (which is described later, see Example 23). As will be appreciated from the example, the thermoelectric device 100 has very practical values of power factor ($S^2/\rho$) when the ratio of the period x and the thickness of the thermoelectric material layer 15 is in these ranges.

In this thermoelectric device 100, it is preferable that the angle θ be formed so as to be in the range of 10° to 50°, and it is more preferably in the range of 20° to 40° (which is described later, see Example 21). As will be appreciated from the example, the thermoelectric device 100 has very practical values of power factor ($S^2/\rho$) when the angle θ is in these ranges.

Furthermore, in the thermoelectric device 100, when the material for the thermoelectric material layer 15 is $Na_bCoO_2$ ($0.3 \leq b \leq 0.8$), the ratio of the period x and the thickness of the metal 16 is preferably in the range of 50:1 to 2:1 and more preferably in the range of 10:1 to 5:1 (which is described later, see Example 26). As will be appreciated from the example, the thermoelectric device 100 has very practical values of power factor ($S^2/\rho$) when the ratio of the period x and the thickness of the metal 16 is in these ranges.

In this thermoelectric device 100, the ratio of the period x and the thickness of the thermoelectric material layer ($Na_b$-$CoO_2$ layer) 15 is preferably in the range of 250:1 to 12.5:1 and more preferably in the range of 100:1 to 25:1 (which is described later, see Example 27). As will be appreciated from the example, the thermoelectric device 100 has very practical values of power factor ($S^2/\rho$) when the ratio of the period x and the thickness of the thermoelectric material layer 15 is in these ranges.

In such a thermoelectric device 100, it is preferable that the angle θ be formed so as to be in the range of 20° to 50°, and it is more preferably in the range of 20° to 40° (which is described later, see Example 25). As will be appreciated from the example, the thermoelectric device 100 has very practical values of power factor ($S^2/\rho$) when the angle θ is in these ranges.

The power factor of the thermoelectric device 100 is particularly preferably 70 ($\mu W/(cm \cdot K^2)$) or higher. This allows the thermoelectric device 100 to be used for many applications.

As described above, the thermoelectric device 100 provides an effect of having a high power generation performance. In the thermoelectric device 100, when the ratio of the period x and the thickness of the metal, the ratio of the period x and the thickness of the thermoelectric material layer 15, and the angle θ are set according to the material for the thermoelectric material layer, the thermoelectric performance obtained thereby exceeds considerably that obtained when the material for the thermoelectric material layer 15 is used by itself. Thus, a more practical thermoelectric device 100 can be provided.

Figure 7B:
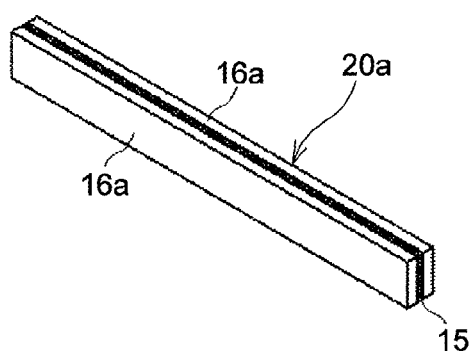
FIG. 7B is a drawing showing the first step of the method of producing the thermoelectric device according to Embodiment 1 of the present invention.

An example of the method of producing a thermoelectric device of the present invention is described with reference to FIGS. 7A to 7E. FIG. 7A is a flow chart showing the process of producing the thermoelectric device according to Embodiment 1 of the present invention. FIGS. 7B to 7E are drawings showing the first to fourth steps of the method of producing the thermoelectric device according to Embodiment 1 of the present invention.

Figure 7C:
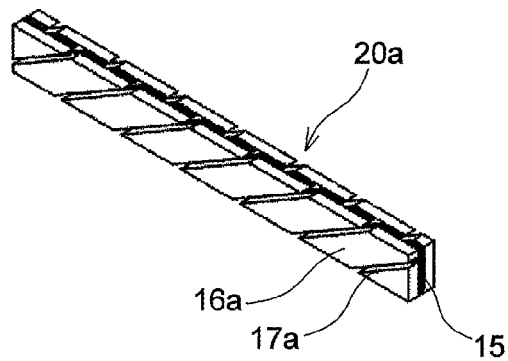
FIG. 7C is a drawing showing the second step of the method of producing the thermoelectric device according to Embodiment 1 of the present invention.

First, as shown in FIG. 7B, two metal plates 16a, the material for which is the same as that for the metal 16, and a plate-like thermoelectric material layer 15 are prepared. The thermoelectric material layer 15 is interposed between the two metal plates 16a. They are then subjected to heating and pressure bonding to be unified and thereby a layered structure 20a with a three-layer structure is produced (step S1). Subsequently, as shown in FIG. 7C, the layered structure 20a with three layers is subjected to groove machining using, for example, an edged tool (step S2). The groove portions 17a formed by the groove machining are places where the insulators 17 are formed. Therefore, the groove machining needs to be carried out with consideration given to, for example, the period of the groove portions 17a and the angle thereof formed with respect to the layered structure 20a. Furthermore, the groove machining is carried out from each side of the layered structure 20a on the sides of the metal plates 16a. In this case, the groove portions 17a in both sides are disposed at the same period (the period x). The groove portions 17a formed in the two metal plates 16a are disposed to be offset from each other by half the period. Furthermore, the depth of the groove portions 17a needs to be equal to or more than the thickness of the metal plate 16a so that the groove portions 17a completely divide at least the metal plate 16a to be subjected to the groove machining.

Figure 7D:
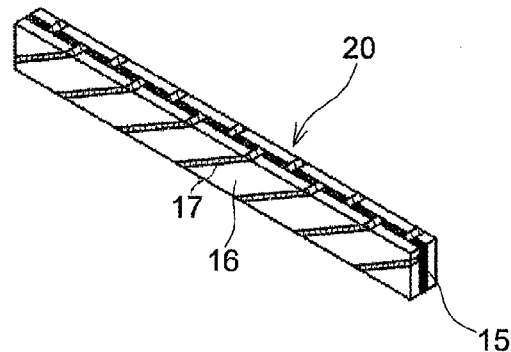
FIG. 7D is a drawing showing the third step of the method of producing the thermoelectric device according to Embodiment 1 of the present invention.

Next, as shown in FIG. 7D, insulators 17 are formed in the groove portions 17a (step S3). Specifically, the insulators 17 can be formed in the groove portions 17a by filling the groove portions 17a with a paste containing a powder of electrical insulator and then solidifying the paste by, for example, a heat treatment. Furthermore, the insulators 17 may be formed by filling the groove portions 17a with a liquid resin and then drying it. Thus, a laminate 20 is produced.

Figure 7E:
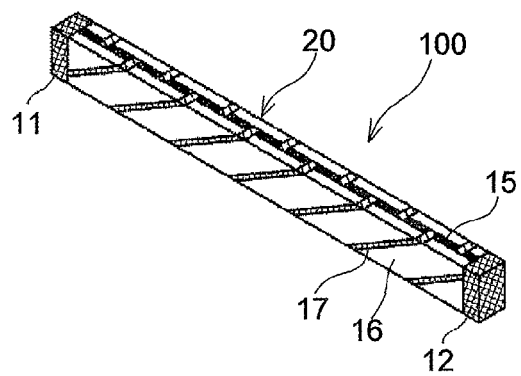
FIG. 7E is a drawing showing the fourth step of the method of producing the thermoelectric device according to Embodiment 1 of the present invention.

Next, as shown in FIG. 7E, a first electrode 11 and a second electrode 12 are produced (step S4). Specifically, in the laminate 20, the first electrode 11 and the second electrode 12 are disposed on the two faces that are perpendicular to the longitudinal direction and that are opposed to each other, respectively. Thus, the thermoelectric device 100 is produced. The first electrode 11 and the second electrode 12 can be produced using various methods such as not only vapor phase growth methods such as a vapor deposition method and a sputtering method but also application of a conductive paste, plating, thermal spraying, and bonding with a solder.

The thermoelectric material layer 15 and the metal plates 16a prepared in step S1 can have sizes that are not equal to that of the laminate 20 but are those that allow a plurality of laminates 20 to be formed. In such a case, after step S3, each laminate 20 can be cut out from the layered structure 20a. In this case, since the direction in which the insulators 17 and the metals 16 are layered varies with, for example, the position and direction of cutting out, each laminate 20 needs to be cut out so as to have a desired layered direction.

The method of producing the thermoelectric device 100 is not limited to the above-mentioned method but can be any method other than this as long as it allows the configuration of the thermoelectric device 100 to be obtained. For example, the layered structure 20a may be produced by periodically bonding parallelogram metal plates to serve as the respective metals 16 to both surfaces of a rectangular thermoelectric material plate at regular intervals and then carrying out steps S3 and S4. In this case, the regular intervals between the metal plates correspond to the groove portions 17a.

Embodiment 2

Figure 8:
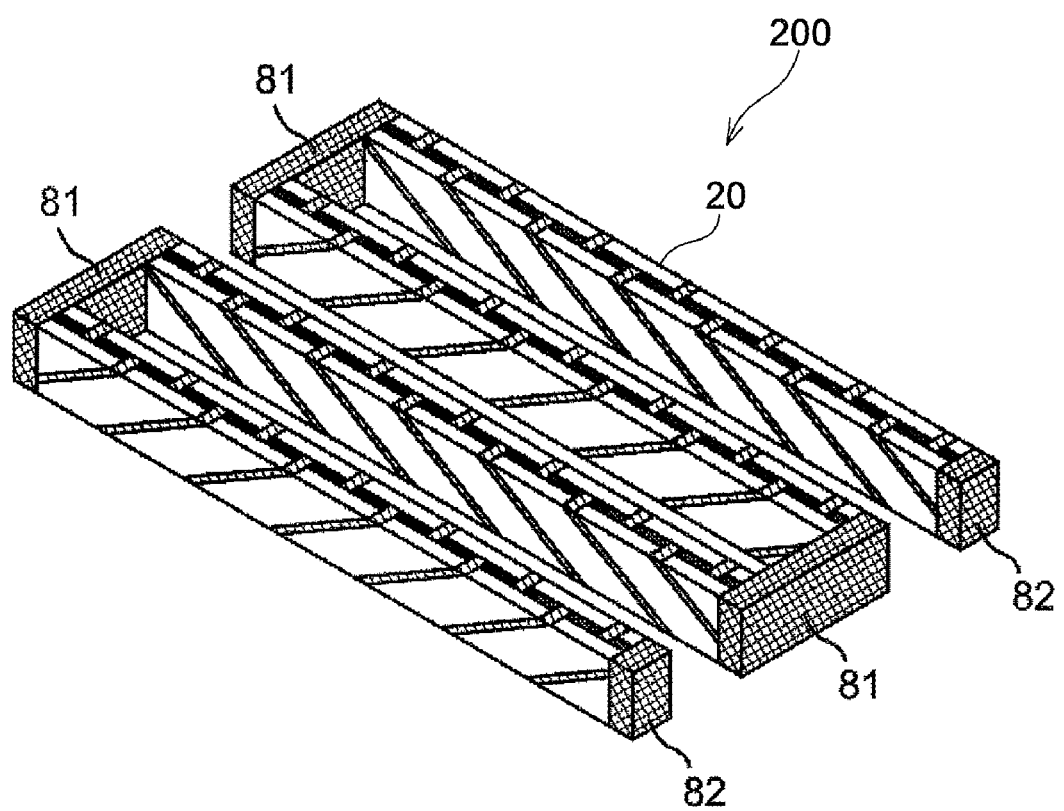
FIG. 8 is a perspective view of a thermoelectric device according to Embodiment 2 of the present invention.

FIG. 8 is a perspective view of a thermoelectric device according to Embodiment 2 of the present invention. As shown in FIG. 8, the thermoelectric device 200 according to Embodiment 2 has a configuration in which a plurality of laminates 20 are connected electrically to one another in series. Descriptions about, for example, the structure and function of the laminate 20 are made in Embodiment 1 and therefore are not repeated herein.

As shown in FIG. 8, the thermoelectric device 200 according to Embodiment 2 includes a plurality (four) of laminates 20 disposed on the same plane in parallel with one another, a plurality (three) of interconnecting electrodes 81 for connecting them to each other, and two extracting electrodes 82 for extracting electrical power from the thermoelectric device 200 to the outside.

The four laminates 20 are connected to one another with the interconnecting electrodes 81 so as to be electrically in series. The extracting electrodes 82 are provided for the ends that are not connected to other laminates 20 among the ends of the laminates 20 located at both ends of this connection body The interconnecting electrodes 81 and the extracting electrodes 82 are not particularly limited as long as they are formed of materials with electrical conductivity. Specifically, a metal such as Cu, Ag, Mo, W, Al, Ti, Cr, Au, Pt, or In, or a nitride or oxide such as TiN, indium tin oxide (ITO), or $SnO_2$ can be used. Furthermore, it also is possible to use a solder or a conductive paste for the interconnecting electrodes 81 and the extracting electrodes 82. The interconnecting electrodes 81 and the extracting electrodes 82 can be produced using various methods such as not only vapor phase growth methods such as a vapor deposition method and a sputtering method but also plating and thermal spraying. In electrically connecting the laminates 20 to one another, it is preferable that they be connected to one another in such a manner that the electromotive forces of the respective laminates 20 that are generated by thermal flow are not cancelled by each other. As shown in FIG. 8, it is preferable that adjacent laminates 20 be disposed in such a manner as to be opposite to each other with respect to the inclination direction of the inclined structure. Furthermore, the thermoelectric device 200 has a configuration in which the four laminates 20 connected electrically to one another are disposed on the same plane in parallel with one another, but the thermoelectric device 200 may be of a plate shape, with the spaces between adjacent laminates 20 being filled with, for example, a resin.

In driving this thermoelectric device 200, a high-temperature body and a low-temperature body are brought into close contact with the upper surface and the lower surface of the thermoelectric device 200, respectively, so that a temperature difference is generated in the device to cause thermal flow. The thermoelectric device 200 converts the thermal flow into electrical power and then outputs it to the outside through the extracting electrodes 82. In the thermoelectric device 200, an increase in mounting area for causing thermal flow in the thermoelectric device 200 allows more electrical power to be generated. In this context, the mounting area denotes the area of a region for allowing heat to come in from and go out to the outside in order to generate a temperature gradient that is required for electrical power generation. Specifically, it is the area of a region, with which the high-temperature body or the low-temperature body is brought into close contact, in the thermoelectric device. Since an increase in the mounting area results in an increase in thermal flow inside the thermoelectric device 200 accordingly, the electromotive force generated thereby also increases. Since the thermoelectric device 200 includes a larger number of laminates 20 as compared to the thermoelectric device 100, it has a larger mounting area and therefore allows more electrical power to be generated.

In the thermoelectric device 200 shown in FIG. 8, four laminates 20 are used, but the number of the laminates 20 is not limited to four as long as the number is a plural. Furthermore, a thermoelectric device may be configured with a plurality of laminates 20 connected electrically in parallel through the interconnecting electrodes 81. The thermoelectric device 200 configured with the laminates 20 connected in series provides an effect of obtaining a high voltage while extracting electrical power. On the other hand, a thermoelectric device configured with the laminates 20 connected in parallel provides an effect of having a lower internal resistance for the whole thermoelectric device. Moreover, the thermoelectric device configured with the laminates 20 connected in parallel has an advantage that an electrical connection can be maintained in the whole device even in the case of a partial electrical disconnection. A thermoelectric device may be configured with a suitable combination of these series and parallel connections.

From the above, the thermoelectric device of the present invention has an excellent power generation performance and promotes application of energy conversion between heat and electricity. Therefore, the present invention has a high industrial value. The thermoelectric device of the present invention can be used as, for example, a power generator that uses heat such as an exhaust gas exhausted from automobiles or factories. Moreover, it also can be used for applications such as a small mobile power generator.

EXAMPLES

Hereinafter, more specific examples of the present invention are described.

Example 1

The thermoelectric device 100 shown in FIG. 1 was produced and the performance thereof was determined. In Example 1, the material for the thermoelectric material layer 15 was $Bi_{0.5}Sb_{1.5}Te_3$. Au, Ag, Cu, or Al was used as the metals 16. Au was used for the first electrode 11 and the second electrode 12. Metal plates with a size of 200 mm×5 mm×2 mm were bonded to both surfaces of a plate material composed of a thermoelectric material with a size of 200 mm×5 mm×0.2 mm by thermocompression bonding and thus a layered structure 20a including the thermoelectric material layer 15 and two metal plates 16a was obtained (see FIG. 7B). Machining to form grooves, each of which had a width of 0.5 mm, a depth of 2.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°.

Furthermore, the groove portions 17a were disposed periodically and the interval between adjacent groove portions 17a corresponding to the period x shown in FIG. 2 was 20 mm. Therefore, the period x is 20 mm. Moreover, the groove portions 17a formed in the two metal plates 16a were disposed to be offset from each other by half the period. Thereafter, electrodes composed of Au were formed at both ends of the long side of the layered structure 20a by the sputtering method. Thus, the thermoelectric device 100 was produced (see FIG. 7E).

With respect to the sample (the thermoelectric device) thus produced, the power generation performance thereof was evaluated. As shown in FIG. 6, one of the surfaces perpendicular to the direction Y of the thermoelectric device 100 was heated to 40° C. with a ceramic heater (a high-temperature body 62), and the other was cooled to 30° C. with a water-cooling apparatus (a low-temperature body 63). Then the electromotive force and the electrical resistance between both the electrodes were measured. The thermoelectric device 100 in which copper was used as the metals 16 had an electromotive force of 18.4 mV and a resistance of 0.44 mΩ. Based on this result, the power factor was estimated to be 457 μW/cmK². Similarly, the performance of the thermoelectric device 100 was determined, with the metals 16 and the angle θ being varied, and the result indicated in Table 1 was obtained.

TABLE 1

[Variations in power factor (μW/cmK²) of the device according to the angle θ (°)]

| Angle θ (°) | 0 | 10 | 20 | 30 | 40 | 50 | 60 | 70 | 80 | 90 |
|---|---|---|---|---|---|---|---|---|---|---|
| Au | 0 | 96 | 261 | 349 | 341 | 271 | 176 | 85 | 22 | 0 |
| Ag | 0 | 167 | 421 | 532 | 501 | 388 | 248 | 120 | 31 | 0 |
| Cu | 0 | 132 | 349 | 457 | 441 | 347 | 224 | 108 | 28 | 0 |
| Al | 0 | 64 | 179 | 247 | 247 | 199 | 130 | 63 | 17 | 0 |

From the above result, it was found that if the metals 16 were other than Al, the thermoelectric device 100 exhibited excellent thermoelectric device properties exceeding 200 μW/cmK² when the angle θ was 20° to 50°. It was confirmed that the thermoelectric device 100 had a higher performance when Ag or Cu was used as the metals 16, as compared to the cases where the other metals were used. Furthermore, in the thermoelectric device 100, even when Al was used as the metals 16, a performance was obtained that was equal to or higher than that of a π-type device containing $Bi_2Te_3$ used therein if the angle θ was 10° to 70°.

Example 2

In the thermoelectric device 100 produced in the same manner as in Example 1, the performance thereof was determined, with the thickness of the metals 16 being varied. $Bi_{1.0}Sb_{1.0}Te_3$ was used for the thermoelectric material layer 15. The angle θ was 30° and the period x was 20 mm. Furthermore, the thickness of the thermoelectric material layer 15 was fixed at 0.2 mm, and the dimensions of the thermoelectric device 100 were a length of 200 mm and a height of 5 mm. Each metal 16 was Cu and the thickness thereof was varied to 0.1 mm, 0.2 mm, 0.5 mm, 1 mm, 2 mm, 5 mm, 20 mm, and 50 mm. Table 2 indicates the measurement result of the power factor of the thermoelectric device 100. It can be understood that the performance of the thermoelectric device 100 depends on the ratio of the period of grooves (the period x) and the thickness of Cu (the metals 16). It was confirmed that the best performance was obtained when the ratio was around 10:1.

TABLE 2

[Variations in power factor (μW/cmK²) of the device according to the ratio of the period x of grooves and the thickness of metal (Cu)]

| Thickness of Metal (mm) | 0.1 | 0.2 | 0.5 | 1 | 2 | 5 | 20 | 50 |
|---|---|---|---|---|---|---|---|---|
| Period of Grooves:Thickness of Cu | 200:1 | 100:1 | 40:1 | 20:1 | 10:1 | 4:1 | 1:1 | 0.4:1 |
| Power Factor (μW/cmK²) | 13 | 38 | 145 | 294 | 448 | 423 | 155 | 67 |

Similarly, Table 3 indicates the measurement result of the power factor of the thermoelectric device 100 that was obtained when the metals 16 were Ag. As indicated in Table 3, even when the metals 16 were Ag, the power factor had the same tendency as that obtained in the case where the metals 16 were Cu.

TABLE 3

[Variations in power factor (μW/cmK²) of the device according to the ratio of the period x of grooves and the thickness of metal (Ag)]

| Thickness of Metal (mm) | 0.1 | 0.2 | 0.5 | 1 | 2 | 5 | 20 | 50 |
|---|---|---|---|---|---|---|---|---|
| Period of Grooves:Thickness of Ag | 200:1 | 100:1 | 40:1 | 20:1 | 10:1 | 4:1 | 1:1 | 0.4:1 |
| Power Factor (μW/cmK²) | 16 | 51 | 189 | 377 | 521 | 475 | 309 | 69 |

Example 3

In the thermoelectric device 100 produced in the same manner as in Example 1, the performance thereof was determined, with the thickness of the thermoelectric material layer 15 being varied. The material for the thermoelectric material layer 15 was $Bi_{1.5}Sb_{0.5}Te_3$. The angle θ was 30° and the period x was 20 mm. Each metal 16 was Cu and the thickness thereof was fixed at 10 mm. The dimensions of the thermoelectric device 100 were a length of 200 mm and a height of 5 mm. The thickness of the thermoelectric material layer 15 was varied to 0.01 mm, 0.02 mm, 0.05 mm, 0.2 mm, 0.5 mm, 1 mm, 2 mm, and 5 mm. Table 4 indicates the measurement result of the power factor of the thermoelectric device 100. It can be understood that the performance of the thermoelectric device 100 depends on the ratio of the period of grooves (the period x) and the thickness of the $Bi_{1.5}Sb_{0.5}Te_3$ layer (the thermoelectric material layer 15). It was confirmed that the best performance was obtained when the ratio was around 100:1.

TABLE 4

[Variations in power factor ($\mu W/cmK^2$) of the device according to the ratio of the period x of grooves and the thickness of the thermoelectric material layer in the case where the metals were Cu]

| Thickness of $Bi_{1.5}Sb_{0.5}Te_3$ layer (mm) | 0.01 | 0.02 | 0.05 | 0.2 | 0.5 | 1 | 2 | 5 |
|---|---|---|---|---|---|---|---|---|
| Period of Grooves:Thickness of $Bi_{1.5}Sb_{0.5}Te_3$ Layer | 2000:1 | 1000:1 | 400:1 | 100:1 | 40:1 | 20:1 | 10:1 | 4:1 |
| Power Factor ($\mu W/cmK^2$) | 43 | 141 | 270 | 282 | 155 | 132 | 105 | 28 |

Similarly, Table 5 indicates the measurement result of the power factor of the thermoelectric device 100 that was obtained when the metals 16 were Ag. As indicated in Table 5, even when the metals 16 were Ag, the power factor had a similar tendency to that obtained in the case where the metals 16 were Cu.

TABLE 5

[Variations in power factor ($\mu W/cmK^2$) of the device according to the ratio of the period x of grooves and the thickness of the thermoelectric material layer in the case where the metals were Ag]

| Thickness of $Bi_{1.5}Sb_{0.5}Te_3$ layer (mm) | 0.01 | 0.02 | 0.05 | 0.2 | 0.5 | 1 | 2 | 5 |
|---|---|---|---|---|---|---|---|---|
| Period of Grooves:Thickness of $Bi_{1.5}Sb_{0.5}Te_3$ Layer | 2000:1 | 1000:1 | 400:1 | 100:1 | 40:1 | 20:1 | 10:1 | 4:1 |
| Power Factor ($\mu W/cmK^2$) | 53 | 119 | 225 | 201 | 112 | 62 | 31 | 11 |

Example 4

The thermoelectric device 200 shown in FIG. 8 was produced and the performance thereof was determined. The thermoelectric device 200 shown in FIG. 8 is configured with four laminates 20, but the thermoelectric device 200 of Example 4 is configured with 15 laminates 20 connected electrically to one another in series. Since the remaining configuration is the same as in FIG. 8, the following descriptions are made with reference to FIG. 8.

In the thermoelectric device 200 of Example 4, In was used for the interconnecting electrodes 81 and the extracting electrodes 82. In each laminate 20, the metals 16 were Cu, and the material for the thermoelectric material layer 15 was $Bi_{0.5}Sb_{1.5}Te_3$. Each laminate 20 was produced by the same production method as in Example 1. Cu plates with a size of 200 mm×5 mm×2 mm were bonded to both surfaces of a plate material composed of $Bi_{0.5}Sb_{1.5}Te_3$ with a size of 200 mm×5 mm×0.2 mm by thermocompression bonding and thus a layered structure 20a was obtained (see FIG. 7B).

Next, machining to form grooves, each of which had a width of 0.5 mm, a depth of 2.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 20 mm. Therefore, the period x is 20 mm. Moreover, the groove portions 17a formed in the two metal plates 16a were disposed to be offset from each other by half the period.

A total of 15 laminates 20 were produced by the above-mentioned process. The 15 laminates 20 thus produced were disposed on the same plane in parallel to one another at intervals of 1 mm. Thereafter, 50-μm thick In foils were heated and pressurized to form the interconnecting electrodes 81 and the extracting electrodes 82, and the laminates 20 were connected electrically to one another. The 15 laminates 20 were connected to one another in series, with the directions of the electromotive forces thereof being aligned along the line of the laminate 20. The gaps between adjacent laminates 20 and the groove portions (the insulators 17) of the laminates 20 were filled with a resin and thereby a plate-shaped thermoelectric device 200 with a size of approximately 200 mm×80 mm×5 mm was produced. The resistance between the extracting electrodes 82 of the thermoelectric device 200 was measured and was 9 mΩ.

The power generation properties of the thermoelectric device 200 of Example 4 were evaluated. First, one surface with a size of 200 mm×80 mm of the thermoelectric device 200 was water-cooled through an alumina plate to serve as a low-temperature body. A ceramic heater to serve as a high-temperature body was brought into close contact with the other surface of the thermoelectric device 200. With such a configuration, the low-temperature body and the high-temperature body were maintained at 25° C. and 40° C. respectively. As a result, the open circuit electromotive force was 0.35 V, and the power factor obtained by estimation was a high value, specifically, 240 $\mu W/cmK^2$. A maximum power of 4.4 W was extracted from the thermoelectric device 200.

Example 5

In Example 5, using Bi as the material for the thermoelectric material layer 15 and Au, Ag, Cu, or Al as the metals 16, the thermoelectric device 100 shown in FIG. 1 was produced. Au was used for the first electrode 11 and the second electrode 12. Metal plates with a size of 200 mm×5 mm×2 mm were bonded to both surfaces of a plate material composed of a thermoelectric material with a size of 200 mm×5 mm×0.4 mm by thermocompression bonding and thus a layered structure 20a including the thermoelectric material layer 15 and two metal plates 16a was obtained (see FIG. 7B). Next, machining to form grooves, each of which had a width of 0.5 mm, a depth of 2.4 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. The groove portions 17a formed in the two metal plates 16a were disposed to be offset from each other by half the period. Thereafter, electrodes composed of Au were formed at both ends of the long side of the layered structure 20a by the sputtering method. Thus, the thermoelectric device 100 was produced (see FIG. 7E).

With respect to the sample (the thermoelectric device) thus produced, the power generation performance thereof was evaluated. As shown in FIG. 6, one of the surfaces perpendicular to the direction Y of the thermoelectric device 100 was heated to 40° C. with a ceramic heater (a high-temperature body 62), and the other was cooled to 30° C. with a water-cooling apparatus (a low-temperature body 63). Then the electromotive force and the electrical resistance between both the electrodes were measured. The thermoelectric device 100 in which copper was used as the metals 16 had an electromotive force of 8.7 mV and a resistance of 0.4 mΩ Based on this result, the power factor was estimated to be 106 µW/cmK$^2$. Similarly the performance of the thermoelectric device 100 was determined, with the metals 16 and the angle θ being varied, and the result indicated in Table 6 was obtained.

TABLE 6

[Variations in power factor (µW/cmK$^2$) of the device according to the angle θ (°)]

| Angle θ (°) | 0 | 10 | 20 | 30 | 40 | 50 | 60 | 70 | 80 | 90 |
|---|---|---|---|---|---|---|---|---|---|---|
| Au | 0 | 22 | 60 | 83 | 83 | 67 | 44 | 21 | 6 | 0 |
| Ag | 0 | 36 | 94 | 122 | 117 | 92 | 59 | 29 | 8 | 0 |
| Cu | 0 | 29 | 78 | 106 | 104 | 83 | 54 | 26 | 7 | 0 |
| Al | 0 | 13 | 38 | 54 | 55 | 45 | 29 | 14 | 4 | 0 |

From the above result, it was found that if the metals 16 were other than Al, the thermoelectric device 100 exhibited excellent thermoelectric device properties of at least 40 µW/cmK$^2$, the power factor of the π-type device containing Bi$_2$Te$_3$ used therein, which currently is used practically, when the angle θ was 20° to 60°. It was confirmed that the thermoelectric device 100 had a higher performance when Ag or Cu was used as the metals 16, as compared to the cases where the other metals were used. Furthermore, in the thermoelectric device 100, even when Al was used as the metals 16, a performance was obtained that was approximately equal to or higher than that of the π-type device containing Bi$_2$Te$_3$ used therein if the angle θ was 20° to 50°.

Example 6

In the thermoelectric device 100 produced in the same manner as in Example 5, the performance thereof was determined, with the thickness of the metals 16 being varied. Bi was used for the thermoelectric material layer 15. The angle θ was 30° and the period x was 10 mm. Furthermore, the thickness of the thermoelectric material layer 15 was fixed at 0.4 mm, and the dimensions of the thermoelectric device 100 were a length of 200 mm and a height of 5 mm. Each metal 16 was Cu and the thickness thereof was varied to 0.2 mm, 0.5 mm, 1 mm, 2 mm, 4 mm, 6 mm, 10 mm, and 15 mm. Table 7 indicates the measurement result of the power factor of the thermoelectric device 100. It can be understood that the per-formance of the thermoelectric device 100 depends on the ratio of the period of grooves (the period x) and the thickness of Cu (the metals 16). It was confirmed that the best performance was obtained when the ratio was around 5:1.

TABLE 7

[Variations in power factor (µW/cmK$^2$) of the device according to the ratio of the period x of grooves and the thickness of metal (Cu)]

| Thickness of Metal (mm) | 0.2 | 0.5 | 1 | 2 | 4 | 8 | 10 | 15 |
|---|---|---|---|---|---|---|---|---|
| Period of Grooves:Thickness of Cu | 50:1 | 20:1 | 10:1 | 5:1 | 2.5:1 | 1.3:1 | 1:1 | 0.7:1 |
| Power Factor (µW/cmK$^2$) | 11 | 41 | 80 | 106 | 94 | 61 | 51 | 36 |

Similarly, Table 8 indicates the measurement result of the power factor of the thermoelectric device 100 that was obtained when the metals 16 were Ag. As indicated in Table 8, even when the metals 16 were Ag, the power factor had the same tendency as that obtained in the case where the metals 16 were Cu.

TABLE 8

[Variations in power factor (µW/cmK$^2$) of the device according to the ratio of the period x of grooves and the thickness of metal (Ag)]

| Thickness of Metal (mm) | 0.2 | 0.5 | 1 | 2 | 4 | 8 | 10 | 15 |
|---|---|---|---|---|---|---|---|---|
| Period of Grooves:Thickness of Ag | 50:1 | 20:1 | 10:1 | 5:1 | 2.5:1 | 1.3:1 | 1:1 | 0.7:1 |
| Power Factor (µW/cmK$^2$) | 13 | 50 | 95 | 122 | 103 | 65 | 54 | 37 |

Example 7

In the thermoelectric device 100 produced in the same manner as in Example 5, the performance thereof was determined, with the thickness of the thermoelectric material layer 15 being varied. The material for the thermoelectric material layer 15 was Bi. The angle θ was 30° and the period x was 10 mm. Each metal 16 was Cu and the thickness thereof was fixed at 2 mm. The dimensions of the thermoelectric device 100 were a length of 200 mm and a height of 5 mm. The thickness of the thermoelectric material layer 15 was varied to 0.04 mm, 0.1 mm, 0.2 mm, 0.4 mm, 0.8 mm, 1 mm, 2 mm, and 3 mm. Table 9 indicates the measurement result of the power factor of the thermoelectric device 100. It can be understood that the performance of the thermoelectric device 100 depends on the ratio of the period of grooves (the period x) and the thickness of the Bi layer (the thermoelectric material layer 15). It was confirmed that the best performance was obtained when the ratio was around 25:1.

TABLE 9

[Variations in power factor (µW/cmK$^2$) of the device according to the ratio of the period x of grooves and the thickness of the thermoelectric material layer in the case where the metals were Cu]

| Thickness of Bi layer (mm) | 0.04 | 0.1 | 0.2 | 0.4 | 0.8 | 1 | 2 | 3 |
|---|---|---|---|---|---|---|---|---|
| Period of Grooves:Thickness of Bi Layer | 250:1 | 100:1 | 50:1 | 25:1 | 12.5:1 | 10:1 | 5:1 | 3.3:1 |

TABLE 9-continued

[Variations in power factor (μW/cmK$^2$) of the device according to the ratio of the period x of grooves and the thickness of the thermoelectric material layer in the case where the metals were Cu]

| Power Factor (μW/cmK$^2$) | 16 | 46 | 82 | 106 | 96 | 89 | 52 | 34 |
|---|---|---|---|---|---|---|---|---|

Similarly, Table 10 indicates the measurement result of the power factor of the thermoelectric device 100 that was obtained when the metals 16 were Ag. As indicated in Table 10, even when the metals 16 were Ag, the power factor had the same tendency as that obtained in the case where the metals 16 were Cu.

TABLE 10

[Variations in power factor (μW/cmK$^2$) of the device according to the ratio of the period x of grooves and the thickness of the thermoelectric material layer in the case where the metals were Ag]

| Thickness of Bi Layer (mm) | 0.04 | 0.1 | 0.2 | 0.4 | 0.8 | 1 | 2 | 3 |
|---|---|---|---|---|---|---|---|---|
| Period of Grooves:Thickness of Bi Layer | 250:1 | 100:1 | 50:1 | 25:1 | 12.5:1 | 10:1 | 5:1 | 3.3:1 |
| Power Factor (μW/cmK$^2$) | 19 | 57 | 98 | 122 | 105 | 92 | 53 | 34 |

Example 8

The thermoelectric device 200 shown in FIG. 8 was produced and the performance thereof was determined. The thermoelectric device 200 shown in FIG. 8 is configured with four laminates 20, but the thermoelectric device 200 of Example 8 is configured with 15 laminates 20 connected electrically to one another in series. Since the remaining configuration is the same as in FIG. 8, the following descriptions are made with reference to FIG. 8.

In the thermoelectric device 200 of Example 8, In was used for the interconnecting electrodes 81 and the extracting electrodes 82. In each laminate 20, the metals 16 were Cu, and the material for the thermoelectric material layer 15 was Bi. Each laminate 20 was produced by the same production method as in Example 5. Cu plates with a size of 200 mm×5 mm×2 mm were bonded to both surfaces of a plate material composed of Bi with a size of 200 mm×5 mm×0.4 mm by thermocompression bonding and thus a layered structure 20a was obtained (see FIG. 7B).

Next, machining to form grooves, each of which had a width of 0.5 mm, a depth of 2.4 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. Moreover, the groove portions 17a formed in the two metal plates 16a were disposed to be offset from each other by half the period.

A total of 15 laminates 20 were produced by the above-mentioned process. The 15 laminates 20 thus produced were disposed on the same plane in parallel to one another at intervals of 1 mm. Thereafter, 50-μm thick In foils were heated and compressed to form the interconnecting electrodes 81 and the extracting electrodes 82, and the laminates 20 were connected electrically to one another. The 15 laminates 20 were connected to one another in series, with the directions of the electromotive forces thereof being aligned along the line of the laminate 20. The gaps between adjacent laminates 20 and the groove portions (the insulators 17) of the laminates 20 were filled with a resin and thereby a plate-shaped thermoelectric device 200 with a size of approximately 200 mm×80 mm×5 mm was produced. The resistance between the extracting electrodes 82 of the thermoelectric device 200 was measured and was 7 mΩ.

The power generation properties of the thermoelectric device 200 of Example 8 were evaluated. First, one surface with a size of 200 mm×80 mm of the thermoelectric device 200 was water-cooled through an alumina plate to serve as a low-temperature body. A ceramic heater to serve as a high-temperature body was brought into close contact with the other surface of the thermoelectric device 200. With such a configuration, the low-temperature body and the high-temperature body were maintained at 25° C. and 40° C. As a result, the open circuit electromotive force was 0.2 V, and the power factor obtained by estimation was a high value, specifically, 96 μW/cmK$^2$. A maximum power of 1.4 W was extracted from the thermoelectric device 200.

Example 9

In Example 9, using PbTe as the material for the thermoelectric material layer 15 and Au, Ag, Cu, or Al as the metals 16, the thermoelectric device 100 shown in FIG. 1 was produced. Au was used for the first electrode 11 and the second electrode 12. Metal plates with a size of 200 mm×5 mm×2 mm were bonded to both surfaces of a plate material composed of a thermoelectric material with a size of 200 mm×5 mm×0.2 mm by thermocompression bonding and thus a layered structure 20a including the thermoelectric material layer 15 and two metal plates 16a was obtained (see FIG. 7B).

Next, machining to form grooves, each of which had a width of 0.5 mm, a depth of 2.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the grooves were disposed periodically and the interval between adjacent groove portions 17a corresponding to the period x shown in FIG. 2 was 20 mm. Therefore, the period x is 20 mm. The groove portions 17a formed in the two metal plates 16a were disposed to be offset from each other by half the period. Thereafter, electrodes composed of Au were formed at both ends of the long side of the layered structure 20a by the sputtering method. Thus, the thermoelectric device 100 was produced (see FIG. 7E).

With respect to the sample (the thermoelectric device) thus produced, the power generation performance thereof was evaluated. As shown in FIG. 6, one of the surfaces perpendicular to the direction Y of the thermoelectric device 100 was heated to 40° C. with a ceramic heater (a high-temperature body 62), and the other was cooled to 30° C. with a water-cooling apparatus (a low-temperature body 63). Then the electromotive force and the electrical resistance between both the electrodes were measured. The thermoelectric device 100 in which copper was used as the metals 16 had an electromotive force of 23.5 mV and a resistance of 1.1 mΩ. Based on this result, the power factor was estimated to be 306 μW/cmK$^2$. Similarly, the performance of the thermoelectric device 100 was determined, with the metals 16 and the angle θ being varied, and the result indicated in Table 11 was obtained.

TABLE 11

[Variations in power factor (μW/cmK$^2$) of the device according to the angle θ(°)]

| Angle θ (°) | 0 | 10 | 20 | 30 | 40 | 50 | 60 | 70 | 80 | 90 |
|---|---|---|---|---|---|---|---|---|---|---|
| Au | 0 | 116 | 220 | 232 | 199 | 146 | 90 | 43 | 11 | 0 |
| Ag | 0 | 198 | 333 | 336 | 281 | 204 | 126 | 59 | 15 | 0 |
| Cu | 0 | 163 | 295 | 306 | 260 | 190 | 118 | 56 | 14 | 0 |
| Al | 0 | 75 | 150 | 164 | 142 | 105 | 65 | 31 | 8 | 0 |

From the above result, it was found that if the metals 16 were other than Al, the thermoelectric device 100 exhibited excellent thermoelectric device properties of about four times or more of the power factor, about 40 μW/cmK$^2$, of the π-type device containing Bi$_2$Te$_3$ used therein, which currently is used practically, when the angle was 20° to 50°. It was confirmed that the thermoelectric device 100 had a higher performance when Ag or Cu was used as the metals 16, as compared to the cases where the other metals were used. Furthermore, in the thermoelectric device 100, even when Al was used as the metals 16, a performance was obtained that was equal to or higher than that of the π-type device containing Bi$_2$Te$_3$ used therein if the angle θ was 10° to 60°.

Example 10

In the thermoelectric device 100 produced in the same manner as in Example 5, the performance thereof was determined, with the thickness of the metals 16 being varied. PbTe was used for the thermoelectric material layer 15. The angle θ was 30° and the period x was 20 mm. Furthermore, the thickness of the thermoelectric material layer 15 was fixed at 0.2 mm, and the dimensions of the thermoelectric device 100 were a length of 200 mm and a height of 5 mm. Each metal 16 was Cu and the thickness thereof was varied to 0.1 mm, 0.2 mm, 0.5 mm, 1 mm, 2 mm, 5 mm, 20 mm, and 50 mm. Table 12 indicates the measurement result of the power factor of the thermoelectric device 100. It can be understood that the performance of the thermoelectric device 100 depends on the ratio of the period of grooves (the period x) and the thickness of Cu (the metals 16). It was confirmed that the best performance was obtained when the ratio was around 10:1.

TABLE 12

[Variations in power factor (μW/cmK$^2$) of the device according to the ratio of the period x of grooves and the thickness of metal (Cu)]

| Thickness of Metal (mm) | 0.1 | 0.2 | 0.5 | 1 | 2 | 5 | 20 | 50 |
|---|---|---|---|---|---|---|---|---|
| Period of Grooves:Thickness of Cu | 200:1 | 100:1 | 40:1 | 20:1 | 10:1 | 4:1 | 1:1 | 0.4:1 |
| Power Factor (μW/cmK$^2$) | 10 | 33 | 121 | 229 | 306 | 263 | 88 | 36 |

Similarly, Table 13 indicates the measurement result of the power factor of the thermoelectric device 100 that was obtained when the metals 16 were Ag. As indicated in Table 13, even when the metals 16 were Ag, the power factor had the same tendency as that obtained in the case where the metals 16 were Cu.

TABLE 13

[Variations in power factor (μW/cmK$^2$) of the device according to the ratio of the period x of grooves and the thickness of metal (Ag)]

| Thickness of Metal (mm) | 0.1 | 0.2 | 0.5 | 1 | 2 | 5 | 20 | 50 |
|---|---|---|---|---|---|---|---|---|
| Period of Grooves:Thickness of Ag | 200:1 | 100:1 | 40:1 | 20:1 | 10:1 | 4:1 | 1:1 | 0.4:1 |
| Power Factor (μW/cmK$^2$) | 12 | 41 | 144 | 261 | 336 | 276 | 91 | 37 |

Example 11

In the thermoelectric device 100 produced in the same manner as in Example 9, the performance thereof was determined, with the thickness of the thermoelectric material layer 15 being varied. The material for the thermoelectric material layer 15 was PbTe. The angle θ was 30° and the period x was 20 mm. Each metal 16 was Cu and the thickness thereof was fixed at 5 mm. The dimensions of the thermoelectric device 100 were a length of 200 mm and a height of 5 mm. The thickness of the thermoelectric material layer 15 was varied to 0.01 mm, 0.02 mm, 0.05 mm, 0.2 mm, 0.5 mm, 1 mm, 2 mm, and 5 mm. Table 14 indicates the measurement result of the power factor of the thermoelectric device 100. It can be understood that the performance of the thermoelectric device 100 depends on the ratio of the period of grooves (the period x) and the thickness of the PbTe layer (the thermoelectric material layer 15). It was confirmed that the best performance was obtained when the ratio was around 100:1.

TABLE 14

[Variations in power factor (μW/cmK$^2$) of the device according to the ratio of the period x of grooves and the thickness of the thermoelectric material in the case where the metals were Cu]

| Thickness of PbTe Layer (mm) | 0.01 | 0.02 | 0.05 | 0.2 | 0.5 | 1 | 2 | 5 |
|---|---|---|---|---|---|---|---|---|
| Period of Grooves:Thickness of PbTe Layer | 2000:1 | 1000:1 | 400:1 | 100:1 | 40:1 | 20:1 | 10:1 | 4:1 |
| Power Factor (μW/cmK$^2$) | 42 | 101 | 219 | 263 | 166 | 95 | 48 | 16 |

Similarly, Table 15 indicates the measurement result of the power factor of the thermoelectric device 100 that was obtained when the metals 16 were Ag. As indicated in Table 15, even when the metals 16 were Ag, the power factor had the same tendency as that obtained in the case where the metals 16 were Cu.

TABLE 15

[Variations in power factor ($\mu W/cmK^2$) of the device according to the ratio of the period x of grooves and the thickness of the thermoelectric material in the case where the metals were Ag]

| Thickness of PbTe Layer (mm) | 0.01 | 0.02 | 0.05 | 0.2 | 0.5 | 1 | 2 | 5 |
|---|---|---|---|---|---|---|---|---|
| Period of Grooves:Thickness of PbTe Layer | 2000:1 | 1000:1 | 400:1 | 100:1 | 40:1 | 20:1 | 10:1 | 4:1 |
| Power Factor ($\mu W/cmK^2$) | 52 | 121 | 248 | 276 | 170 | 96 | 48 | 18 |

Example 12

The thermoelectric device 200 shown in FIG. 8 was produced and the performance thereof was determined. The thermoelectric device 200 shown in FIG. 8 is configured with four laminates 20, but the thermoelectric device 200 of Example 12 is configured with 15 laminates 20 connected electrically to one another in series. Since the remaining configuration is the same as in FIG. 8, the following descriptions are made with reference to FIG. 8.

In the thermoelectric device 200 of Example 12, In was used for the interconnecting electrodes 81 and the extracting electrodes 82. In each laminate 20, the metals 16 were Cu, and the material for the thermoelectric material layer 15 was PbTe. Each laminate 20 was produced by the same production method as in Example 9. Cu plates with a size of 200 mm×5 mm×2 mm were bonded to both surfaces of a plate material composed of PbTe with a size of 200 mm×5 mm×0.2 mm by thermocompression bonding and thus a layered structure 20a was obtained (see FIG. 7B).

Next, machining to form grooves, each of which had a width of 0.5 mm, a depth of 2.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 20 mm. Therefore, the period x is 20 mm. Moreover, the groove portions 17a formed in the two metal plates 16a were disposed to be offset from each other by half the period.

A total of 15 laminates 20 were produced by the above-mentioned process. The 15 laminates 20 thus produced were disposed on the same plane in parallel to one another at intervals of 1 mm. Thereafter, 50-μm thick In foils were heated and pressurized to form the interconnecting electrodes 81 and the extracting electrodes 82, and the laminates 20 were connected electrically to one another. The 15 laminates 20 were connected to one another in series, with the directions of the electromotive forces thereof being aligned along the line of the laminate 20. The gaps between adjacent laminates 20 and the groove portions (the insulators 17) of the laminates 20 were filled with a resin and thereby a plate-shaped thermoelectric device 200 with a size of approximately 200 mm×80 mm×5 mm was produced. The resistance between the extracting electrodes 82 of the thermoelectric device 200 was measured and was 18 mΩ.

The power generation properties of the thermoelectric device 200 of Example 12 were evaluated. First, one surface with a size of 200 mm×80 mm of the thermoelectric device 200 was water-cooled through an alumina plate to serve as a low-temperature body. A ceramic heater to serve as a high-temperature body was brought into close contact with the other surface of the thermoelectric device 200. With such a configuration, the low-temperature body and the high-temperature body were maintained at 25° C. and 40° C. As a result, the open circuit electromotive force was 0.48 V, and the power factor obtained by estimation was a high value, specifically, 230 $\mu W/cmK^2$. A maximum power of 3.3 W was extracted from the thermoelectric device 200.

Example 13

In Example 13, using $Si_{0.8}Ge_{0.2}$ as the material for the thermoelectric material layer 15 and Au, Ag, Cu, or Al as the metals 16, the thermoelectric device 100 shown in FIG. 1 was produced. Au was used for the first electrode 11 and the second electrode 12. Metal plates with a size of 200 mm×5 mm×2 mm were bonded to both surfaces of a plate material composed of a thermoelectric material with a size of 200 mm×5 mm×0.2 mm by thermocompression bonding and thus a layered structure 20a including the thermoelectric material layer 15 and two metal plates 16a was obtained (see FIG. 7B).

Next, machining to form grooves, each of which had a width of 0.5 mm, a depth of 2.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. The groove portions 17a formed in the two metal plates 16a were disposed to be offset from each other by half the period. Thereafter, electrodes composed of Au were formed at both ends of the long side of the layered structure 20a by the sputtering method. Thus, the thermoelectric device 100 was produced (see FIG. 7E).

With respect to the sample (the thermoelectric device) thus produced, the power generation performance thereof was evaluated. As shown in FIG. 6, one of the surfaces perpendicular to the direction Y of the thermoelectric device 100 was heated to 40° C. with a ceramic heater (a high-temperature body 62), and the other was cooled to 30° C. with a water-cooling apparatus (a low-temperature body 63). Then the electromotive force and the electrical resistance between both the electrodes were measured. The thermoelectric device 100 in which copper was used as the metals 16 had an electromotive force of 17.7 mV and a resistance of 1.5 mΩ. Based on this result, the power factor was estimated to be 124 $\mu W/cmK^2$. Similarly, the performance of the thermoelectric device 100 was determined, with the metals 16 and the angle θ being varied, and the result indicated in Table 16 was obtained.

TABLE 16

[Variations in power factor ($\mu W/cmK^2$) of the device according to the inclination angle $\theta(°)$]

| Angle $\theta$ (°) | 0 | 10 | 20 | 30 | 40 | 50 | 60 | 70 | 80 | 90 |
|---|---|---|---|---|---|---|---|---|---|---|
| Au | 0 | 61 | 101 | 101 | 84 | 61 | 37 | 18 | 4 | 0 |
| Ag | 0 | 93 | 138 | 133 | 109 | 78 | 48 | 22 | 6 | 0 |
| Cu | 0 | 79 | 126 | 124 | 103 | 74 | 45 | 21 | 5 | 0 |
| Al | 0 | 44 | 77 | 79 | 66 | 48 | 30 | 14 | 3 | 0 |

From the above result, it was found that if the metals 16 were other than Al, the thermoelectric device 100 exhibited excellent thermoelectric device properties of about three times or more of the power factor, about 40 $\mu W/cmK^2$, of the π-type device containing $Bi_2Te_3$ used therein, which currently is used practically, when the angle $\theta$ was 20° to 40°. It was confirmed that the thermoelectric device 100 had a higher performance when Ag or Cu was used as the metals 16, as compared to the cases where the other metals were used. Furthermore, in the thermoelectric device 100, even when Al was used as the metals 16, a performance was obtained that was equal to or higher than that of the π-type device containing $Bi_2Te_3$ used therein if the angle $\theta$ was 10° to 50°.

Example 14

In the thermoelectric device 100 produced in the same manner as in Example 13, the performance thereof was determined, with the thickness of the metals 16 being varied. $Si_{0.8}Ge_{0.2}$ was used for the thermoelectric material layer 15.

The angle $\theta$ was 30° and the period x was 10 mm. Furthermore, the thickness of the thermoelectric material layer 15 was fixed at 0.2 mm, and the dimensions of the thermoelectric device 100 were a length of 200 mm and a height of 5 mm. Table 17 indicates the measurement result of the power factor of the thermoelectric device 100 in which each metal 16 was Cu and the thickness thereof was varied to 0.2 mm, 0.5 mm, 1 mm, 2 mm, 4 mm, 5 mm, 6 mm, and 10 mm. It can be understood that the performance of the thermoelectric device 100 depends on the ratio of the period of grooves (the period x) and the thickness of Cu (the metals 16). It was confirmed that the best performance was obtained when the ratio was around 10:1 or 5:1. Moreover, although the measurement result is not indicated, the same tendency was obtained even when the metals 16 were Ag.

TABLE 17

[Variations in power factor ($\mu W/cmK^2$) of the device according to the ratio of the period x of grooves and the thickness of metal (Cu)]

| Thickness of Metal (mm) | 0.2 | 0.5 | 1 | 2 | 4 | 5 | 6 | 10 |
|---|---|---|---|---|---|---|---|---|
| Period of Grooves:Thickness of Cu | 50:1 | 20:1 | 10:1 | 5:1 | 2.5:1 | 2:1 | 1.67:1 | 1:1 |
| Power Factor ($\mu W/cmK^2$) | 29 | 84 | 124 | 124 | 89 | 75 | 65 | 35 |

Example 15

In the thermoelectric device 100 produced in the same manner as in Example 13, the performance thereof was determined, with the thickness of the thermoelectric material layer 15 being varied. The material for the thermoelectric material layer 15 was $Si_{0.8}Ge_{0.2}$. The angle $\theta$ was 30° and the period x was 10 mm. Each metal 16 was Cu and the thickness thereof was fixed at 2 mm. The dimensions of the thermoelectric device 100 were a length of 200 mm and a height of 5 mm. The thickness of the thermoelectric material layer 15 was varied to 0.02 mm, 0.04 mm, 0.1 mm, 0.2 mm, 0.4 mm, 0.8 mm, 1 mm, and 2 mm. Table 18 indicates the measurement result of the power factor of the thermoelectric device 100. It can be understood that the performance of the thermoelectric device 100 depends on the ratio of the period of grooves (the period x) and the thickness of the $Si_{0.8}Ge_{0.2}$ layer (the thermoelectric material layer 15). It was confirmed that the best performance was obtained when the ratio was around 50:1. Moreover, although the measurement result is not indicated, the same tendency was obtained even when the metals 16 were Ag.

TABLE 18

[Variations in power factor ($\mu W/cmK^2$) of the device according to the ratio of the period x of grooves and the thickness of the thermoelectric material in the case where the metals were Cu]

| Thickness of $Si_{0.8}Ge_{0.2}$ Layer (mm) | 0.02 | 0.04 | 0.1 | 0.2 | 0.4 | 0.8 | 1 | 2 |
|---|---|---|---|---|---|---|---|---|
| Period of Grooves:Thickness of $Si_{0.8}Ge_{0.2}$ Layer | 500:1 | 250:1 | 100:1 | 50:1 | 25:1 | 12.5:1 | 10:1 | 5:1 |
| Power Factor ($\mu W/cmK^2$) | 32 | 69 | 119 | 124 | 96 | 58 | 47 | 22 |

Example 16

The thermoelectric device 200 shown in FIG. 8 was produced and the performance thereof was determined. The thermoelectric device 200 shown in FIG. 8 is configured with four laminates 20, but the thermoelectric device 200 of Example 16 is configured with 15 laminates 20 connected electrically to one another in series. Since the remaining configuration is the same as in FIG. 8, the following descriptions are made with reference to FIG. 8.

In the thermoelectric device 200 of Example 16, In was used for the interconnecting electrodes 81 and the extracting electrodes 82. In each laminate 20, the metals 16 were Cu, and the material for the thermoelectric material layer 15 was $Si_{0.8}Ge_{0.2}$. Each laminate 20 was produced by the same production method as in Example 13. Cu plates with a size of 200 mm×5 mm×2 mm were bonded to both surfaces of a plate material composed of $Si_{0.8}Ge_{0.2}$ with a size of 200 mm×5 mm×0.2 mm by thermocompression bonding and thus a layered structure 20a was obtained (see FIG. 7B).

Next, machining to form grooves, each of which had a width of 0.5 mm, a depth of 2.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. Moreover, the groove portions 17a formed in the two metal plates 16a were disposed to be offset from each other by half the period.

A total of 15 laminates 20 were produced by the above-mentioned process. The 15 laminates 20 thus produced were disposed on the same plane in parallel to one another at intervals of 1 mm. Thereafter, 50-μm thick In foils were heated and compressed to form the interconnecting electrodes 81 and the extracting electrodes 82, and the laminates 20 were connected electrically to one another. The 15 laminates 20 were connected to one another in series, with the directions of the electromotive forces thereof being aligned along the line of the laminate 20. The gaps between adjacent laminates 20 and the groove portions (the insulators 17) of the laminates 20 were filled with a resin and thereby a plate-shaped thermoelectric device 200 with a size of approximately 200 mm×80 mm×5 mm was produced. The resistance between the extracting electrodes 82 of the thermoelectric device 200 was measured and was 24 mΩ.

The power generation properties of the thermoelectric device 200 of Example 16 were evaluated. First, one surface with a size of 200 mm×80 mm of the thermoelectric device 200 was water-cooled through an alumina plate to serve as a low-temperature body. A ceramic heater to serve as a high-temperature body was brought into close contact with the other surface of the thermoelectric device 200. With such a configuration, the low-temperature body and the high-temperature body were maintained at 25° C. and 40° C. As a result, the open circuit electromotive force was 0.39 V, and the power factor obtained by estimation was a high value, specifically, 112 μW/cmK$^2$. A maximum power of 1.6 W was extracted from the thermoelectric device 200.

Example 17

In Example 17, using CoSi as the material for the thermoelectric material layer 15 and Au, Ag, Cu, or Al as the metals 16, the thermoelectric device 100 shown in FIG. 1 was produced. Au was used for the first electrode 11 and the second electrode 12. Metal plates with a size of 200 mm×5 mm×2 mm were bonded to both surfaces of a plate material composed of a thermoelectric material with a size of 200 mm×5 mm×0.4 mm by thermocompression bonding and thus a layered structure 20a including the thermoelectric material layer 15 and two metal plates 16a was obtained (see FIG. 7B).

Next, machining to form grooves, each of which had a width of 0.5 mm, a depth of 2.4 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. The groove portions 17a formed in the two metal plates 16a were disposed to be offset from each other by half the period.

Thereafter, electrodes composed of Au were formed at both ends of the long side of the layered structure 20a by the sputtering method. Thus, the thermoelectric device 100 was produced (see FIG. 7E).

With respect to the sample (the thermoelectric device) thus produced, the power generation performance thereof was evaluated. As shown in FIG. 6, one of the surfaces perpendicular to the direction Y of the thermoelectric device 100 was heated to 40° C. with a ceramic heater (a high-temperature body 62), and the other was cooled to 30° C. with a water-cooling apparatus (a low-temperature body 63). Then the electromotive force and the electrical resistance between both the electrodes were measured. The thermoelectric device 100 in which copper was used as the metals 16 had an electromotive force of 8.6 mV and a resistance of 0.49 mΩ. Based on this result, the power factor was estimated to be 87 μW/cmK$^2$. Similarly, the performance of the thermoelectric device 100 was determined, with the metals 16 and the angle θ being varied, and the result indicated in Table 19 was obtained.

TABLE 19

[Variations in power factor (μW/cmK$^2$) of the device according to the inclination angle θ(°)]

| Angle θ (°) | 0 | 10 | 20 | 30 | 40 | 50 | 60 | 70 | 80 | 90 |
|---|---|---|---|---|---|---|---|---|---|---|
| Au | 0 | 20 | 53 | 69 | 66 | 52 | 33 | 16 | 4 | 0 |
| Ag | 0 | 33 | 80 | 98 | 90 | 69 | 43 | 21 | 5 | 0 |
| Cu | 0 | 27 | 69 | 87 | 82 | 63 | 40 | 19 | 5 | 0 |
| Al | 0 | 12 | 40 | 45 | 44 | 35 | 22 | 11 | 2 | 0 |

From the above result, it was found that if the metals 16 were other than Al, the thermoelectric device 100 exhibited excellent thermoelectric device properties of about twice or more of the power factor, about 40 μW/cmK$^2$, of the π-type device containing Bi$_2$Te$_3$ used therein, which currently is used practically, when the angle θ was 20° to 50°. It was confirmed that the thermoelectric device 100 had a higher performance when Ag or Cu was used as the metals 16, as compared to the cases where the other metals were used. Furthermore, in the thermoelectric device 100, even when Al was used as the metals 16, a performance was obtained that was equal to or higher than that of the π-type device containing Bi$_2$Te$_3$ used therein if the angle θ was 20° to 40°.

Example 18

In the thermoelectric device 100 produced in the same manner as in Example 17, the performance thereof was determined, with the thickness of the metals 16 being varied. CoSi was used for the thermoelectric material layer 15. The angle θ was 30° and the period x was 10 mm. Furthermore, the thickness of the thermoelectric material layer 15 was fixed at 0.4 mm, and the dimensions of the thermoelectric device 100 were a length of 200 mm and a height of 5 mm. Table 20 indicates the measurement result of the power factor of the thermoelectric device 100 in which each metal 16 was Cu and the thickness thereof was varied to 0.2 mm, 0.5 mm, 1 mm, 2 mm, 4 mm, 5 mm, 8 mm, and 10 mm. It can be understood that the performance of the thermoelectric device 100 depends on the ratio of the period of grooves (the period x) and the thickness of Cu (the metals 16). It was confirmed that the best performance was obtained when the ratio was around 5:1. Moreover, although the measurement result is not indicated, the same tendency was obtained even when the metals 16 were Ag.

TABLE 20

[Variations in power factor ($\mu$W/cmK$^2$) of the device according to the ratio of the period x of grooves and the thickness of metal (Cu)]

| Thickness of Metal (mm) | 0.2 | 0.5 | 1 | 2 | 4 | 5 | 8 | 10 |
|---|---|---|---|---|---|---|---|---|
| Period of Grooves:Thickness of Cu | 50:1 | 20:1 | 10:1 | 5:1 | 2.5:1 | 2:1 | 1.25:1 | 1:1 |
| Power Factor ($\mu$W/cmK$^2$) | 9 | 41 | 70 | 87 | 73 | 64 | 45 | 35 |

Example 19

In the thermoelectric device 100 produced in the same manner as in Example 17, the performance thereof was determined, with the thickness of the thermoelectric material layer 15 being varied. The material for the thermoelectric material layer 15 was CoSi. The angle θ was 30° and the period x was 10 mm. Each metal 16 was Cu and the thickness thereof was fixed at 2 mm. The dimensions of the thermoelectric device 100 were a length of 200 mm and a height of 5 mm. The thickness of the thermoelectric material layer 15 was varied to 0.04 mm, 0.1 mm, 0.2 mm, 0.4 mm, 0.8 mm, 1.2 mm, 1.6 mm, and 2 mm. Table 21 indicates the measurement result of the power factor of the thermoelectric device 100. It can be understood that the performance of the thermoelectric device 100 depends on the ratio of the period of grooves (the period x) and the thickness of the CoSi layer (the thermoelectric material layer 15). It was confirmed that the best performance was obtained when the ratio was around 25:1. Moreover, although the measurement result is not indicated, the same tendency was obtained even when the metals 16 were Ag.

TABLE 21

[Variations in power factor ($\mu$W/cmK$^2$) of the device according to the ratio of the period x of grooves and the thickness of the thermoelectric material in the case where the metals were Cu]

| Thickness of CoSi Layer (mm) | 0.04 | 0.1 | 0.2 | 0.4 | 0.8 | 1.2 | 1.6 | 2 |
|---|---|---|---|---|---|---|---|---|
| Period of Grooves:Thickness of CoSi Layer | 250:1 | 100:1 | 50:1 | 25:1 | 12.5:1 | 8.33:1 | 6.25:1 | 5:1 |
| Power Factor ($\mu$W/cmK$^2$) | 14 | 42 | 71 | 87 | 74 | 58 | 46 | 37 |

Example 20

The thermoelectric device 200 shown in FIG. 8 was produced and the performance thereof was determined. The thermoelectric device 200 shown in FIG. 8 is configured with four laminates 20, but the thermoelectric device 200 of Example 20 is configured with 15 laminates 20 connected electrically to one another in series. Since the remaining configuration is the same as in FIG. 8, the following descriptions are made with reference to FIG. 8.

In the thermoelectric device 200 of Example 20, In was used for the interconnecting electrodes 81 and the extracting electrodes 82. In each laminate 20, the metals 16 were Cu, and the material for the thermoelectric material layer 15 was CoSi. Each laminate 20 was produced by the same production method as in Example 17. Cu plates with a size of 200 mm×5 mm×2 mm were bonded to both surfaces of a plate material composed of CoSi with a size of 200 mm×5 mm×0.4 mm by thermocompression bonding and thus a layered structure 20a was obtained (see FIG. 7B).

Next, machining to form grooves, each of which had a width of 0.5 mm, a depth of 2.4 mm, and an inclination angle of 30° with respect to the long side of the laminate, was carried out with respect to portions of the metal plates 16a of the layered structure 20a from both sides with an end mill (see FIG. 7C). Accordingly, the angle θ is 30°. Furthermore, the groove portions 17a were disposed periodically and the interval between adjacent groove portions 17a corresponding to the period x shown in FIG. 2 was 10 mm. Therefore, the period x is 10 mm. Moreover, the groove portions 17a formed in the two metal plates 16a were disposed to be offset from each other by half the period.

A total of 15 laminates 20 were produced by the above-mentioned process. The 15 laminates 20 thus produced were disposed on the same plane in parallel to one another at intervals of 1 mm. Thereafter, 50-μm thick In foils were heated and pressurized to form the interconnecting electrodes 81 and the extracting electrodes 82, and the laminates 20 were connected electrically to one another. The 15 laminates 20 were connected to one another in series, with the directions of the electromotive forces thereof being aligned along the line of the laminate 20. The gaps between adjacent laminates 20 and the groove portions (the insulators 17) of the laminates 20 were filled with a resin and thereby a plate-shaped thermoelectric device 200 with a size of approximately 200 mm×80 mm×5 mm was produced. The resistance between the extracting electrodes 82 of the thermoelectric device 200 was measured and was 7.3 mΩ.

The power generation properties of the thermoelectric device 200 of Example 20 were evaluated. First, one surface with a size of 200 mm×80 mm of the thermoelectric device 200 was water-cooled through an alumina plate to serve as a low-temperature body. A ceramic heater to serve as a high-temperature body was brought into close contact with the other surface of the thermoelectric device 200. With such a configuration, the low-temperature body and the high-temperature body were maintained at 25° C. and 40° C. As a result, the open circuit electromotive force was 0.20 V, and the power factor obtained by estimation was a high value, specifically, 87 μW/cmK$^2$. A maximum power of 1.4 W was extracted from the thermoelectric device 200.

Example 21

In Example 21, using SrTiO$_3$ as the material for the thermoelectric material layer 15 and Au, Ag, Cu, or Al as the metals 16, the thermoelectric device 100 shown in FIG. 1 was produced. Au was used for the first electrode 11 and the second electrode 12. Metal plates with a size of 200 mm×5 mm×2 mm were bonded to both surfaces of a plate material composed of a thermoelectric material with a size of 200 mm×5 mm×0.2 mm by thermocompression bonding and thus a layered structure 20a including the thermoelectric material layer 15 and two metal plates 16a was obtained (see FIG. 7B).

Next, machining to form grooves, each of which had a width of 0.5 mm, a depth of 2.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. The groove portions 17a formed in the two metal plates 16a were disposed to be offset from each other by half the period. Thereafter, electrodes composed of Au were formed at both ends of the long side of the layered structure 20a by the sputtering method. Thus, the thermoelectric device 100 was produced (see FIG. 7E).

With respect to the sample (the thermoelectric device) thus produced, the power generation performance thereof was evaluated. As shown in FIG. 6, one of the surfaces perpendicular to the direction Y of the thermoelectric device 100 was heated to 40° C. with a ceramic heater (a high-temperature body 62), and the other was cooled to 30° C. with a water-cooling apparatus (a low-temperature body 63). Then the electromotive force and the electrical resistance between both the electrodes were measured. The thermoelectric device 100 in which copper was used as the metals 16 had an electromotive force of 20.0 mV and a resistance of 1.8 mΩ. Based on this result, the power factor was estimated to be 104 $\mu W/cmK^2$. Similarly, the performance of the thermoelectric device 100 was determined, with the metals 16 and the angle θ being varied, and the result indicated in Table 22 was obtained.

TABLE 22

[Variations in power factor ($\mu W/cmK^2$) of the device according to the angle θ(°)]

| Angle θ (°) | 0 | 10 | 20 | 30 | 40 | 50 | 60 | 70 | 80 | 90 |
|---|---|---|---|---|---|---|---|---|---|---|
| Au | 0 | 52 | 80 | 78 | 64 | 46 | 28 | 13 | 3 | 0 |
| Ag | 0 | 86 | 120 | 112 | 91 | 65 | 40 | 18 | 4 | 0 |
| Cu | 0 | 73 | 109 | 104 | 85 | 61 | 37 | 17 | 4 | 0 |
| Al | 0 | 31 | 51 | 51 | 42 | 30 | 18 | 9 | 2 | 0 |

From the above result, it was found that if the metals 16 were other than Al, the thermoelectric device 100 exhibited excellent thermoelectric device properties equal to or higher than the power factor, about 40 $\mu W/cmK^2$, of the π-type device containing $Bi_2Te_3$ used therein, which currently is used practically, when the angle θ was 10° to 50°. It was confirmed that the thermoelectric device 100 had a higher performance when Ag or Cu was used as the metals 16, as compared to the cases where the other metals were used. Furthermore, in the thermoelectric device 100, even when Al was used as the metals 16, a performance was obtained that was approximately equal to or higher than that of the π-type device containing $Bi_2Te_3$ used therein if the angle θ was 20° to 40°.

Example 22

In the thermoelectric device 100 produced in the same manner as in Example 21, the performance thereof was determined, with the thickness of the metals 16 being varied. $SrTiO_3$ was used for the thermoelectric material layer 15. The angle θ was 30° and the period x was 10 mm. Furthermore, the thickness of the thermoelectric material layer 15 was fixed at 0.2 mm, and the dimensions of the thermoelectric device 100 were a length of 200 mm and a height of 5 mm. Table 23 indicates the measurement result of the power factor of the thermoelectric device 100 in which each metal 16 was Cu and the thickness thereof was varied to 0.2 mm, 0.5 mm, 1 mm, 2 mm, 4 mm, 6 mm, 8 mm, and 10 mm. It can be understood that the performance of the thermoelectric device 100 depends on the ratio of the period of grooves (the period x) and the thickness of Cu (the metals 16). It was confirmed that the best performance was obtained when the ratio was around 5:1. Moreover, although the measurement result is not indicated, the same tendency was obtained even when the metals 16 were Ag.

TABLE 23

[Variations in power factor ($\mu W/cmK^2$) of the device according to the ratio of the period x of grooves and the thickness of metal (Cu)]

| Thickness of Metal (mm) | 0.2 | 0.5 | 1 | 2 | 4 | 6 | 8 | 10 |
|---|---|---|---|---|---|---|---|---|
| Period of Grooves:Thickness of Cu | 50:1 | 20:1 | 10:1 | 5:1 | 2.5:1 | 1.67:1 | 1.25:1 | 1:1 |
| Power Factor ($\mu W/cmK^2$) | 15 | 49 | 85 | 105 | 86 | 65 | 51 | 34 |

Example 23

In the thermoelectric device 100 produced in the same manner as in Example 21, the performance thereof was determined, with the thickness of the thermoelectric material layer 15 being varied. The material for the thermoelectric material layer 15 was $SrTiO_3$. The angle θ was 30° and the period x was 10 mm. Each metal 16 was Cu and the thickness thereof was fixed at 2 mm. The dimensions of the thermoelectric device 100 were a length of 200 mm and a height of 5 mm. The thickness of the thermoelectric material layer 15 was varied to 0.02 mm, 0.04 mm, 0.1 mm, 0.2 mm, 0.8 mm, 1.2 mm, 1.6 mm, and 2 mm. Table 24 indicates the measurement result of the power factor of the thermoelectric device 100. It can be understood that the performance of the thermoelectric device 100 depends on the ratio of the period of grooves (the period x) and the thickness of the $SrTiO_3$ layer (the thermoelectric material layer 15). It was confirmed that the best performance was obtained when the ratio was around 50:1. Moreover, although the measurement result is not indicated, the same tendency was obtained even when the metals 16 were Ag.

TABLE 24

[Variations in power factor ($\mu W/cmK^2$) of the device according to the ratio of the period x of grooves and the thickness of the thermoelectric material in the case where the metals were Cu]

| Thickness of $SrTiO_3$ (mm) | 0.02 | 0.04 | 0.1 | 0.2 | 0.8 | 1.2 | 1.6 | 2 |
|---|---|---|---|---|---|---|---|---|
| Period of Grooves:Thickness of $SrTiO_3$ | 500:1 | 250:1 | 100:1 | 50:1 | 12.5:1 | 8.33:1 | 6.25:1 | 5:1 |
| Power Factor ($\mu W/cmK^2$) | 15 | 42 | 79 | 105 | 75 | 56 | 43 | 31 |

Example 24

The thermoelectric device 200 shown in FIG. 8 was produced and the performance thereof was determined. The thermoelectric device 200 shown in FIG. 8 is configured with four laminates 20, but the thermoelectric device 200 of Example 24 is configured with 15 laminates 20 connected electrically to one another in series. Since the remaining configuration is the same as in FIG. 8, the following descriptions are made with reference to FIG. 8.

In the thermoelectric device 200 of Example 24, In was used for the interconnecting electrodes 81 and the extracting electrodes 82. In each laminate 20, the metals 16 were Cu, and the material for the thermoelectric material layer 15 was $SrTiO_3$. Each laminate 20 was produced by the same production method as in Example 21. Cu plates with a size of 200 mm×5 mm×2 mm were bonded to both surfaces of a plate material composed of $SrTiO_3$ with a size of 200 mm×5 mm×0.2 mm by thermocompression bonding and thus a layered structure 20a was obtained (see FIG. 7B).

Next, machining to form grooves, each of which had a width of 0.5 mm, a depth of 2.2 mm, and an inclination angle of 30° with respect to the long side of the laminate, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. Moreover, the groove portions 17a formed in the two metal plates 16a were disposed to be offset from each other by half the period.

A total of 15 laminates 20 were produced by the above-mentioned process. The 15 laminates 20 thus produced were disposed on the same plane in parallel to one another at intervals of 1 mm. Thereafter; 50-μm thick In foils were heated and pressurized to form the interconnecting electrodes 81 and the extracting electrodes 82, and the laminates 20 were connected electrically to one another. The 15 laminates 20 were connected to one another in series, with the directions of the electromotive forces thereof being aligned along the line of the laminate 20. The gaps between adjacent laminates 20 and the groove portions (the insulators 17) of the laminates 20 were filled with a resin and thereby a plate-shaped thermoelectric device 200 with a size of approximately 200 mm×80 mm×5 mm was produced. The resistance between the extracting electrodes 82 of the thermoelectric device 200 was measured and was 27.5 mΩ.

The power generation properties of the thermoelectric device 200 of Example 24 were evaluated. First, one surface with a size of 200 mm×80 mm of the thermoelectric device 200 was water-cooled through an alumina plate to serve as a low-temperature body. A ceramic heater to serve as a high-temperature body was brought into close contact with the other surface of the thermoelectric device 200. With such a configuration, the low-temperature body and the high-temperature body were maintained at 25° C. and 40° C. As a result, the open circuit electromotive force was 0.40 V, and the power factor obtained by estimation was a high value, specifically, 105 μW/cmK². A maximum power of 1.5 W was extracted from the thermoelectric device 200.

Example 25

In Example 25, using $Na_{0.5}CoO_2$ as the material for the thermoelectric material layer 15 and Au, Ag, Cu, or Al as the metals 16, the thermoelectric device 100 shown in FIG. 1 was produced. Au was used for the first electrode 11 and the second electrode 12. Metal plates with a size of 200 mm×5 mm×1 mm were bonded to both surfaces of a plate material composed of a thermoelectric material with a size of 200 mm×5 mm×0.2 mm by thermocompression bonding and thus a layered structure 20a including the thermoelectric material layer 15 and two metal plates 16a was obtained (see FIG. 7B).

Next, machining to form grooves, each of which had a width of 0.5 mm, a depth of 1.2 mm, and an inclination angle of 30° with respect to the long side of the layered structure 20a, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. The groove portions 17a formed in the two metal plates 16a were disposed to be offset from each other by half the period. Thereafter, electrodes composed of Au were formed at both ends of the long side of the layered structure 20a by the sputtering method. Thus, the thermoelectric device 100 was produced (see FIG. 7E).

With respect to the sample (the thermoelectric device) thus produced, the power generation performance thereof was evaluated. As shown in FIG. 6, one of the surfaces perpendicular to the direction Y of the thermoelectric device 100 was heated to 40° C. with a ceramic heater (a high-temperature body 62), and the other was cooled to 30° C. with a water-cooling apparatus (a low-temperature body 63). Then the electromotive force and the electrical resistance between both the electrodes were measured. The thermoelectric device 100 in which copper was used as the metals 16 had an electromotive force of 10.7 mV and a resistance of 1.3 mΩ. Based on this result, the power factor was estimated to be 99 μW/cmK². Similarly, the performance of the thermoelectric device 100 was determined, with the metals 16 and the angle θ being varied, and the result indicated in Table 25 was obtained.

TABLE 25

| [Variations in power factor (μW/cmK²) of the device according to the angle θ(°)] | | | | | | | | | | |
|---|---|---|---|---|---|---|---|---|---|---|
| Angle θ (°) | 0 | 10 | 20 | 30 | 40 | 50 | 60 | 70 | 80 | 90 |
| Au | 0 | 29 | 68 | 81 | 74 | 56 | 35 | 17 | 5 | 0 |
| Ag | 0 | 47 | 99 | 111 | 98 | 73 | 45 | 21 | 6 | 0 |
| Cu | 0 | 38 | 86 | 99 | 89 | 67 | 42 | 20 | 5 | 0 |
| Al | 0 | 22 | 53 | 65 | 60 | 46 | 29 | 14 | 3 | 0 |

From the above result, it was found that if the metals 16 were other than Al, the thermoelectric device 100 exhibited excellent thermoelectric device properties of about twice or more of the power factor, about 40 μW/cmK², of the π-type device containing $Bi_2Te_3$ used therein, which currently is used practically, when the angle θ was 20° to 40°. It was confirmed that the thermoelectric device 100 had a higher performance when Ag or Cu was used as the metals 16, as compared to the cases where the other metals were used. Furthermore, in the thermoelectric device 100, even when Al was used as the metals 16, a performance was obtained that was equal to or higher than that of the π-type device containing $Bi_2Te_3$ used therein if the angle θ was 20° to 50°.

Example 26

In the thermoelectric device 100 produced in the same manner as in Example 25, the performance thereof was determined, with the thickness of the metals 16 being varied.

$Na_{0.8}CoO_2$ was used for the thermoelectric material layer 15. The angle θ was 30° and the period x was 10 mm. Furthermore, the thickness of the thermoelectric material layer 15 was fixed at 0.2 mm, and the dimensions of the thermoelectric device 100 were a length of 200 mm and a height of 5 mm. Table 26 indicates the measurement result of the power factor of the thermoelectric device 100 in which each metal 16 was Cu and the thickness thereof was varied to 0.1 mm, 0.2 mm, 0.5 mm, 1 mm, 2 mm, 5 mm, 8 mm, and 10 mm. It can be understood that the performance of the thermoelectric device 100 depends on the ratio of the period of grooves (the period x) and the thickness of Cu (the metals 16). It was confirmed that the best performance was obtained when the ratio was around 10:1. Moreover, although the measurement result is not indicated, the same tendency was obtained even when the metals 16 were Ag.

TABLE 26

[Variations in power factor ($\mu W/cmK^2$) of the device according to the ratio of the period x of grooves and the thickness of metal (Cu)]

| Thickness of Metal (mm) | 0.1 | 0.2 | 0.5 | 1 | 2 | 5 | 8 | 10 |
|---|---|---|---|---|---|---|---|---|
| Period of Grooves:Thickness of Cu | 100:1 | 50:1 | 20:1 | 10:1 | 5:1 | 2:1 | 1.25:1 | 1:1 |
| Power Factor ($\mu W/cmK^2$) | 12 | 35 | 83 | 102 | 84 | 54 | 30 | 24 |

Example 27

In the thermoelectric device 100 produced in the same manner as in Example 25, the performance thereof was determined, with the thickness of the thermoelectric material layer 15 being varied. The material for the thermoelectric material layer 15 was $Na_{0.3}CoO_2$. The angle θ was 30° and the period x was 10 mm. Each metal 16 was Cu and the thickness thereof was fixed at 1 mm. The dimensions of the thermoelectric device 100 were a length of 200 mm and a height of 5 mm. The thickness of the thermoelectric material layer 15 was varied to 0.02 mm, 0.04 mm, 0.1 mm, 0.2 mm, 0.4 mm, 0.8 mm, 1 mm, and 1.6 mm. Table 27 indicates the measurement result of the power factor of the thermoelectric device 100. It can be understood that the performance of the thermoelectric device 100 depends on the ratio of the period of grooves (the period x) and the thickness of the $Na_{0.3}CoO_2$ layer (the thermoelectric material layer 15). It was confirmed that the best performance was obtained when the ratio was around 50:1. Moreover, although the measurement result is not indicated, the same tendency was obtained even when the metals 16 were Ag.

Example 28

The thermoelectric device 200 shown in FIG. 8 was produced and the performance thereof was determined. The thermoelectric device 200 shown in FIG. 8 is configured with four laminates 20, but the thermoelectric device 200 of Example 28 is configured with 15 laminates 20 connected electrically to one another in series. Since the remaining configuration is the same as in FIG. 8, the following descriptions are made with reference to FIG. 8.

In the thermoelectric device 200 of Example 28, In was used for the interconnecting electrodes 81 and the extracting electrodes 82. In each laminate 20, the metals 16 were Cu, and the material for the thermoelectric material layer 15 was $Na_{0.4}CoO_2$. Each laminate 20 was produced by the same production method as in Example 25. Cu plates with a size of 200 mm×5 mm×2 mm were bonded to both surfaces of a plate material composed of $Na_{0.4}CoO_2$ with a size of 200 mm×5 mm×0.2 mm by thermocompression bonding and thus a layered structure 20a was obtained (see FIG. 7B).

Next, machining to form grooves, each of which had a width of 0.5 mm, a depth of 2.2 mm, and an inclination angle of 30° with respect to the long side of the laminate, was carried out with respect to portions of the metal plates 16a of the layered structure 20a from both sides with an end mill (see FIG. 7C). Accordingly, the angle θ shown in FIG. 2 is 30°. Furthermore, the groove portions 17a were disposed periodically and the interval between adjacent groove portions 17a corresponding to the period x shown in FIG. 2 was 10 mm. Therefore, the period x is 10 mm. Moreover, the groove portions 17a formed in the two metal plates 16a were disposed to be offset from each other by half the period.

A total of 15 laminates 20 were produced by the above-mentioned process. The 15 laminates 20 thus produced were disposed on the same plane in parallel to one another at intervals of 1 mm. Thereafter, 50-μm thick In foils were heated and pressurized to form the interconnecting electrodes 81 and the extracting electrodes 82, and the laminates 20 were connected electrically to one another. The 15 laminates 20 were connected to one another in series, with the directions of the electromotive forces thereof being aligned along the line of the laminate 20. The gaps between adjacent laminates 20 and the groove portions (the insulators 17) of the laminates 20 were filled with a resin and thereby a plate-shaped thermoelectric device 200 with a size of approximately 200 mm×80 mm×5 mm was produced. The resistance between the extracting electrodes 82 of the thermoelectric device 200 was measured and was 16 mΩ.

The power generation properties of the thermoelectric device 200 of Example 28 were evaluated. First, one surface with a size of 200 mm×80 mm of the thermoelectric device 200 was water-cooled through an alumina plate to serve as a

TABLE 27

[Variations in power factor ($\mu W/cmK^2$) of the device according to the ratio of the period x of grooves and the thickness of the thermoelectric material in the case where the metals were Cu]

| Thickness of $Na_{0.3}CoO_2$ Layer (mm) | 0.02 | 0.04 | 0.1 | 0.2 | 0.4 | 0.8 | 1 | 1.6 |
|---|---|---|---|---|---|---|---|---|
| Period of Grooves:Thickness of $Na_{0.3}CoO_2$ Layer | 500:1 | 250:1 | 100:1 | 50:1 | 25:1 | 12.5:1 | 10:1 | 6.25:1 |
| Power Factor ($\mu W/cmK^2$) | 22 | 48 | 92 | 95 | 76 | 44 | 35 | 20 | low-temperature body. A ceramic heater to serve as a high-temperature body was brought into close contact with the other surface of the thermoelectric device 200. With such a configuration, the low-temperature body and the high-temperature body were maintained at 25° C. and 40° C. As a result, the open circuit electromotive force was 0.28 V, and the power factor obtained by estimation was a high value, specifically, 84 μW/cmK$^2$. A maximum power of 1.2 W was extracted from the thermoelectric device 200.

INDUSTRIAL APPLICABILITY

The present invention can be used for thermoelectric devices that convert thermal energy to electrical energy.

The invention claimed is:

1. A thermoelectric device, comprising:
a first electrode and a second electrode that are disposed to be opposed to each other, and
a laminate that is interposed between the first electrode and the second electrode, is connected electrically to both the first electrode and the second electrode, and is layered in a direction orthogonal to an electromotive-force extracting direction, which is the direction in which the first electrode and the second electrode are opposed to each other, wherein
the laminate comprises a thermoelectric material layer, a first holding layer and a second holding layer that are arranged so that the thermoelectric material layer is between the first holding layer and the second holding layer,
each of the first holding layer and the second holding layer has layered structures in which metals and insulators are layered alternately, respectively, and having layer surfaces that are slanted with respect to the electromotive-force extraction direction, and
the insulators of the first holding layer and the insulators of the second holding layer are disposed alternately in the electromotive-force extracting direction.

2. The thermoelectric device according to claim 1, wherein the layered structures of the first holding layer and the second holding layer are both periodic layered structures,
a period at which the insulators are layered in the first holding layer is the same as that at which the insulators are layered in the second holding layer, and
the insulators of the first holding layer and the insulators of the second holding layer are disposed to be offset from each other by half the period in the direction in which they are layered.

3. The thermoelectric device according to claim 1, wherein the thermoelectric material layer is a Si$_{0.8}$Ge$_{0.2}$ layer.

4. The thermoelectric device according to claim 3, wherein the layer surfaces are slanted with respect to the electromotive-force extracting direction at a slant angle of 10° to 50°.

5. The thermoelectric device according to claim 4, wherein the layer surfaces are slanted with respect to the electromotive-force extracting direction at a slant angle of 20° to 40°.

6. The thermoelectric device according to claim 3, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and
the ratio of the period at which the insulators are layered and the thickness of the metals is in a range of 20:1 to 1.67:1.

7. The thermoelectric device according to claim 6, wherein the ratio of the period at which the insulators are layered and the thickness of the metals is in a range of 10:1 to 2:1.

8. The thermoelectric device according to claim 3, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and
the ratio of the period at which the insulators are layered and the thickness of the thermoelectric material layer is in a range of 250:1 to 10:1.

9. The thermoelectric device according to claim 8, wherein the ratio of the period at which the insulators are layered and the thickness of the thermoelectric material layer is in a range of 100:1 to 25:1.

10. The thermoelectric device according to claim 1, wherein the thermoelectric material layer is a Bi$_{2-a}$SbTe$_3$ layer wherein 0<a<2.

11. The thermoelectric device according to claim 10, wherein the layer surfaces are slanted with respect to the electromotive-force extracting direction at a slant angle of 10° to 70°.

12. The thermoelectric device according to claim 11, wherein the layer surfaces are slanted with respect to the electromotive-force extracting direction at a slant angle of 20° to 50°.

13. The thermoelectric device according to claim 10, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and
the ratio of the period at which the insulators are layered and the thickness of the metals is in a range of 100:1 to 0.4:1.

14. The thermoelectric device according to claim 13, wherein the ratio of the period at which the insulators are layered and the thickness of the metals is in a range of 40:1 to 1:1.

15. The thermoelectric device according to claim 10, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and the ratio of the period at which the insulators are layered and the thickness of the thermoelectric material layer is in a range of 1000:1 to 20:1.

16. The thermoelectric device according to claim 15, wherein the ratio of the period at which the insulators are layered and the thickness of the thermoelectric material layer is in a range of 400:1 to 100:1.

17. The thermoelectric device according to claim 1, wherein the thermoelectric material layer is a Bi layer.

18. The thermoelectric device according to claim 17, wherein the layer surfaces are slanted with respect to the electromotive-force extracting direction at a slant angle of 20° to 60°.

19. The thermoelectric device according to claim 18, wherein the layer surfaces are slanted with respect to the electromotive-force extracting direction at a slant angle of 20° to 50°.

20. The thermoelectric device according to claim 17, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and
the ratio of the period at which the insulators are layered and the thickness of the metals is in a range of 20:1 to 1:1.

21. The thermoelectric device according to claim 20, wherein the ratio of the period at which the insulators are layered and the thickness of the metals is in a range of 10:1 to 2.5:1.

22. The thermoelectric device according to claim 17, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and
the ratio of the period at which the insulators are layered and the thickness of the thermoelectric material layer is in a range of 100:1 to 5:1.

23. The thermoelectric device according to claim 22, wherein the ratio of the period at which the insulators are layered and the thickness of the thermoelectric material layer is in a range of 50:1 to 10:1.

24. The thermoelectric device according to claim 1, wherein the thermoelectric material layer is a PbTe layer.

25. The thermoelectric device according to claim 24, wherein the layer surfaces are slanted with respect to the electromotive-force extracting direction at a slant angle of 10° to 60°.

26. The thermoelectric device according to claim 25, wherein the layer surfaces are slanted with respect to the electromotive-force extracting direction at a slant angle of 20° to 50°.

27. The thermoelectric device according to claim 24, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and
the ratio of the period at which the insulators are layered and the thickness of the metals is in a range of 100:1 to 0.4:1.

28. The thermoelectric device according to claim 27, wherein the ratio of the period at which the insulators are layered and the thickness of the metals is in a range of 40:1 to 1:1.

29. The thermoelectric device according to claim 24, wherein the layered structures of the first holding layer and the second holding layer are both periodic layered structures,
a period at which the insulators are layered in the first holding layer is the same as that at which the insulators are layered in the second holding layer,
the insulators of the first holding layer and the insulators of the second holding layer are disposed to be offset from each other by half the period in the direction in which they are layered, and
the ratio of the period at which the insulators are layered and the thickness of the thermoelectric material layer is in a range of 1000:1 to 10:1.

30. The thermoelectric device according to claim 29, wherein the ratio of the period at which the insulators are layered and the thickness of the thermoelectric material layer is in a range of 400:1 to 40:1.

31. The thermoelectric device according to claim 1, wherein the metals are Cu, Ag, or Au.

32. The thermoelectric device according to claim 1, wherein the metals are Al.

33. The thermoelectric device according to claim 1, having a power factor of at least 70 μ W/(cm ·K$^2$).

34. A power generation method using a thermoelectric device, comprising applying a temperature difference in the thermoelectric device and thereby obtaining electrical power from the thermoelectric device,
wherein the thermoelectric device comprises:
a first electrode and a second electrode that are disposed to be opposed to each other, and
a laminate that is interposed between the first electrode and the second electrode, is connected electrically to both the first electrode and the second electrode, and is layered in a direction orthogonal to an electromotive-force extracting direction, which is the direction in which the first electrode and the second electrode are opposed to each other, wherein
the laminate comprises a thermoelectric material layer' a first holding layer and a second holding layer that are arranged so that the thermoelectric material layer is between the first holding layer and the second holding layer,
each of the first holding layer and the second holding layer has layered structures in which metals and insulators that are layered alternately, respectively, and having layer surfaces that are slanted with respect to the electromotive-force extraction direction,
the insulators of the first holding layer and the insulators of the second holding layer are disposed alternately in the electromotive-force extracting direction, and
a temperature difference is applied in the direction orthogonal to the layered direction of the laminate and orthogonal to the electromotive-force extracting direction, so that electrical power is obtained through the first electrode and the second electrode.

35. The thermoelectric device according to claim 1, wherein a temperature difference is applied in the direction orthogonal to the layered direction of the laminate and orthogonal to the electromotive-force extracting direction, so that electrical power is obtained through the first electrode and the second electrode.

* * * * *

UNITED STATES PATENT AND TRADEMARK OFFICE
CERTIFICATE OF CORRECTION

| | | |
|---|---|---|
| PATENT NO. | : 7,994,415 B2 | Page 1 of 1 |
| APPLICATION NO. | : 12/811182 | |
| DATED | : August 9, 2011 | |
| INVENTOR(S) | : Kanno et al. | |

It is certified that error appears in the above-identified patent and that said Letters Patent is hereby corrected as shown below:

Column 40, line 52 (claim 34): "layer" should read --layer,--.

Signed and Sealed this
Sixth Day of March, 2012

David J. Kappos
*Director of the United States Patent and Trademark Office*

UNITED STATES PATENT AND TRADEMARK OFFICE
CERTIFICATE OF CORRECTION

PATENT NO.        : 7,994,415 B2                                    Page 1 of 1
APPLICATION NO.   : 12/811182
DATED             : August 9, 2011
INVENTOR(S)       : Kanno et al.

It is certified that error appears in the above-identified patent and that said Letters Patent is hereby corrected as shown below:

Column 38, line 31 (claim 10): "$0<a<2$" should read -- $0 \leq a \leq 2$ --.

Signed and Sealed this
Fourteenth Day of August, 2012

David J. Kappos
*Director of the United States Patent and Trademark Office*